(12) United States Patent
Jachmann et al.

(10) Patent No.: US 12,248,114 B2
(45) Date of Patent: Mar. 11, 2025

(54) CORRECTION OF NUCLEAR MAGNETIC RESONANCE DATA IN HIGH VIBRATION ENVIRONMENTS

(71) Applicant: Halliburton Energy Services, Inc., Houston, TX (US)

(72) Inventors: Rebecca Jachmann, Houston, TX (US); Jie Yang, Houston, TX (US)

(73) Assignee: Halliburton Energy Services, Inc., Houston, TX (US)

(*) Notice: Subject to any disclaimer, the term of this patent is extended or adjusted under 35 U.S.C. 154(b) by 372 days.

(21) Appl. No.: 17/380,315

(22) Filed: Jul. 20, 2021

(65) Prior Publication Data

US 2022/0365242 A1 Nov. 17, 2022

Related U.S. Application Data

(60) Provisional application No. 63/185,979, filed on May 7, 2021.

(51) Int. Cl.
| | |
|---|---|
| G01V 3/34 | (2006.01) |
| G01R 33/44 | (2006.01) |
| G01R 33/50 | (2006.01) |
| G01R 33/561 | (2006.01) |
| G01V 3/32 | (2006.01) |
| G01N 24/08 | (2006.01) |

(52) U.S. Cl.
CPC ............ *G01V 3/34* (2013.01); *G01R 33/448* (2013.01); *G01R 33/50* (2013.01); *G01R 33/5615* (2013.01); *G01V 3/32* (2013.01); *G01N 24/081* (2013.01)

(58) Field of Classification Search
CPC . G01V 3/34; G01V 3/32; G01R 33/50; G01R 33/5615; G01R 33/448; G01N 24/081
See application file for complete search history.

(56) References Cited

U.S. PATENT DOCUMENTS

| | | | |
|---|---|---|---|
| 6,380,738 B1 | 4/2002 | Zhou | |
| 6,437,564 B1 | 8/2002 | Itskovich et al. | |
| 9,915,750 B2* | 3/2018 | Hurlimann | ........... G01N 24/081 |
| 10,134,127 B2* | 11/2018 | Falahatpisheh | .. G01R 33/56316 |
| 2004/0008027 A1* | 1/2004 | Prammer | ................. G01V 3/32 |
| | | | 702/6 |

(Continued)

OTHER PUBLICATIONS

Search Report and Written Opinion issued for International Patent Application No. PCT/US2021/042302, dated Jan. 26, 2022, 9 pages, ISR/KR.

*Primary Examiner* — Nasima Monsur
*Assistant Examiner* — Joseph O Nyamogo
(74) *Attorney, Agent, or Firm* — Benjamin Ford; C. Tumey Law Group PLLC

(57) ABSTRACT

Described herein are methods for removing the vibration induced additional signal obtained during downhole NMR operations. The additional signal is removed by analyzing a number of instances of data sets neighbors, at either the raw echo, reconstructed echoes, or the spectrum which results from inversion. A number of neighboring data instances are analyzed together to find the minimal (lowest) common values in each. Thereafter, the minimal value replaces the previous value across the data instances, thereby removing the extra signal.

20 Claims, 28 Drawing Sheets

(56) References Cited

U.S. PATENT DOCUMENTS

| | | | |
|---|---|---|---|
| 2004/0041562 A1* | 3/2004 | Speier | G01V 3/32 |
| | | | 324/303 |
| 2012/0226137 A1* | 9/2012 | Ito | A61B 5/055 |
| | | | 600/410 |
| 2013/0103319 A1* | 4/2013 | Buiting | G01V 11/00 |
| | | | 702/86 |
| 2013/0207814 A1 | 8/2013 | Tietjen et al. | |
| 2016/0018555 A1 | 1/2016 | Jachmann et al. | |
| 2017/0004137 A1* | 1/2017 | Raina | G06T 11/206 |
| 2021/0103071 A1 | 4/2021 | Jachmann et al. | |
| 2021/0177296 A1* | 6/2021 | Saalbach | G16H 30/40 |

\* cited by examiner

T1 Uphole Inversion

T1
or

CORRECTION OF NUCLEAR MAGNETIC RESONANCE DATA IN HIGH VIBRATION ENVIRONMENTS

PRIORITY

This application is a non-provisional of and claims priority to U.S. Provisional Patent Application No. 63/185,979 filed on May 7, 2021, having the same title and inventorship, the benefit of which is claimed and the disclosure of which is incorporated herein by reference in its entirety.

BACKGROUND

Nuclear magnetic resonance (NMR) has two main experiments in oil field downhole usage. The first experiment is to assess $T_1$ buildup of magnetization. The second experiment is to observe the decay of magnetization once it has been excited, in which the decay has a time constant of $T_2$.

Measurement of $T_1$ is indirect and is done by varying the polarization times after magnetization has, through some means, been nullified or inverted. For downhole observation, a NMR measurement technique, designed by Carr, Purcell, Meiboom, and Gill and, hence, referred to as CPMG, is used. It is considered a $T_2$ measurement. CPMG has an excitation pulse followed by several refocusing pulses to counter the magnetic gradients in downhole NMR systems.

A $T_1$ sequence is typically done as: NullPulse-WaitTime-Excitation Pulse-Recover pulses. Typically, the sequence has several different wait times. The number of recovery pulses may be as few as 3 and as many as the electronics can handle. Typically, the number of recovery pulses is less than 2000. Further, in NMR while drilling or logging, the magnetization in a magnetic field is constantly working to align itself towards the magnetic field. The magnitude at which the magnetization does this is proportional to the magnetic field. However, as in any system that gets perturbed, it takes time to get to an equilibrium state. The rate at which the equilibrium is achieved is described by the time constant $T_1$, as mentioned above.

When the NMR tool is moving, the magnetization produced by a field generated by a magnet within the NMR tool is constantly experiencing a shift from equilibrium. When the NMR tool is moving fast enough, the magnetization effectively picks up magnetic memory. The magnetization's profile is similar to that of the magnetic field but is lagging behind.

Executing the NMR experiments downhole on a moving NMR tool is a challenge. Processing the data from a moving tool downhole can lead to compromised data. Previous techniques have been shown which can handle this axial motion complication both in post processing and real time (RT) data using a motion inclusive inversion. However, other motional complications still need addressing.

When drilling wells, the level of vibration and slip stick can be well above what is generally expected for the NMR tool to experience. The reported data with current processing which can included a (axial) motion inclusive inversion via a single inversion in post processing or a multiple step inversion when done in real time still overcalls (results in errors) compared to other porosity measurements. The exact cause of the undesirable signal is yet to be determined; however, the cause could be related to borehole signal, or tool elastic motion. Such causes might more specifically be the borehole signal being present in the echo train, the addition of signal due to the sensitive volume (the volume in which signal is obtainable from a NMR due the to the gradient of B0 and the transmission frequency and pulse bandwidth (BW) of the antenna) changing shape, or translational motion putting the sensitive volume momentarily in the borehole. In any case, the undesirable additional signal shows a strong correlation with vibration or slip stick. Ultimately, the reported signal is not the true porosity of the formation, which leads to costly erroneous logs and resulting wellbore operations. Accordingly, the resulting issue which needs to be addressed is that of the erroneous additional signal.

Conventional approaches to the unwanted additional signal have been insufficient. Conventionally, the NMR data effected by severe motion effects, such as that of exceedingly high vibration or the stick slip condition, is simply discarded as the readings are untrustworthy or proven to be wrong. Discarding the readings results in higher logging costs and/or costly drilling mistakes.

DETAILED DESCRIPTION

Figure 1:
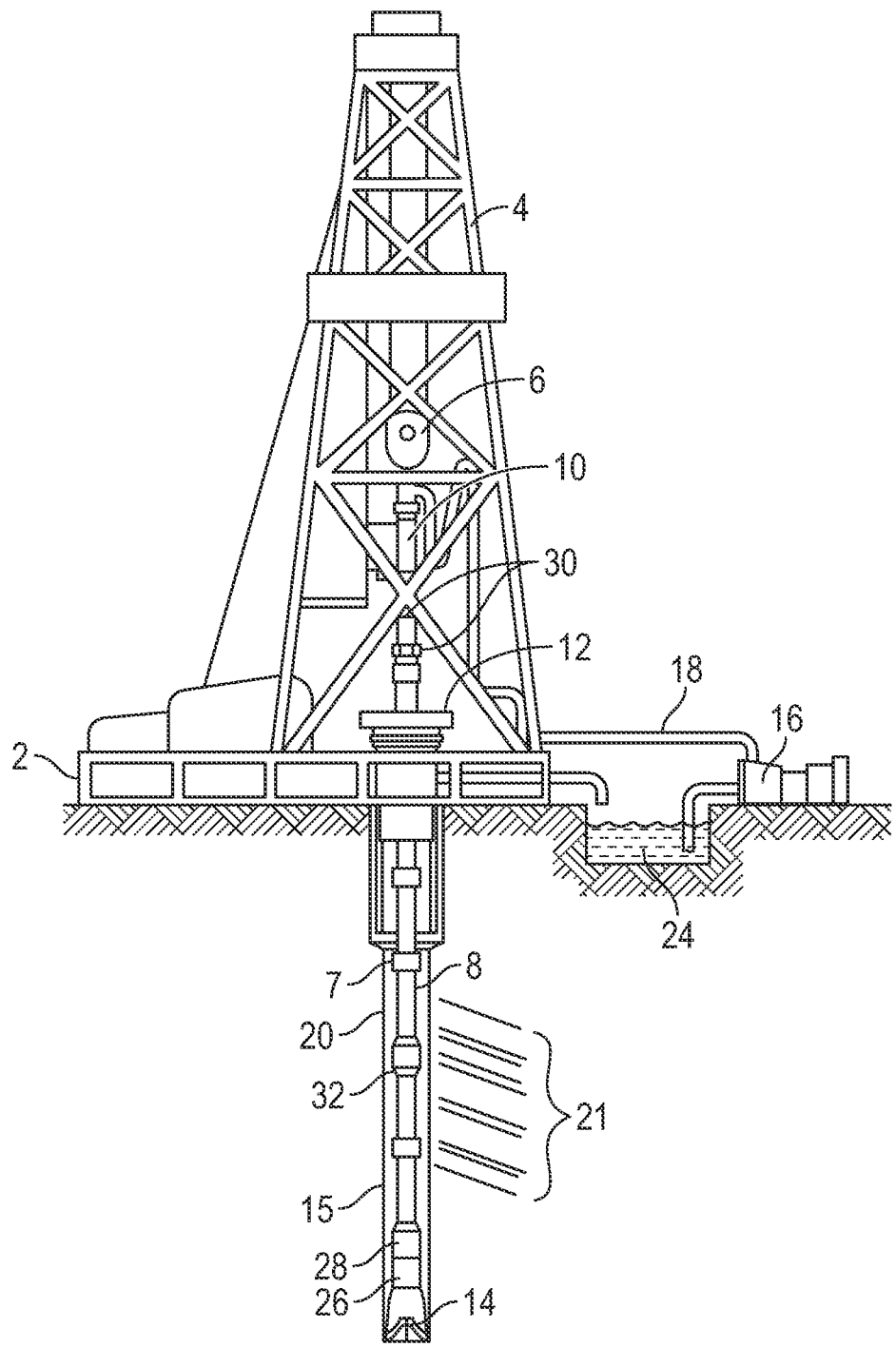
FIG. 1 shows an illustrative logging while drilling (LWD) environment.

The following detailed description illustrates embodiments of the present disclosure. These embodiments are described in sufficient detail to enable a person of ordinary skill in the art to practice these embodiments without undue experimentation. It should be understood, however, that the embodiments and examples described herein are given by way of illustration only, and not by way of limitation. Various substitutions, modifications, additions, and rearrangements may be made that remain potential applications of the disclosed techniques. Therefore, the description that follows is not to be taken as limiting on the scope of the appended claims. In particular, an element associated with a particular embodiment should not be limited to association with that particular embodiment but should be assumed to be capable of association with any embodiment discussed herein.

Embodiments and methods of the present disclosure provide methods for removing the undesired additional signal obtained during downhole NMR operations. Since the motion occurring during acquisition of each specific echo train would be different, each train has a different amount of undesired additional signal. As described herein, this additional signal can be removed by analyzing a number of instances of data sets neighbors, at either the raw echo, reconstructed echoes, or the spectrum which results from inversion. A number of neighboring data instances are analyzed together to find the minimal (lowest) common values in each. Thereafter, the minimal value is recorded into a new dataset in a new log.

In a generalized embodiment, the present disclosure provides a method of generating a log using nuclear magnetic resonance. Data signals are first acquired using an NMR tool positioned in a borehole. The received data could be an echo train, where the echo train was produced by transmitting multiple pulses on an antenna, and then receiving signal from an antenna after the pulses, excluding the first, and sometimes second pulse. The signal, is deconvoluted and integrated to make an echo. The echoes are grouped together creating an echo train. The received data may be composed of many echo trains, wherein the first pulse is an inversion or saturation pulse. A time follows this pulse, called the wait time which is incremented through different times. The wait time is followed by and excitation pulse, which has a recovery pulse after it. Following the recovery pulse, the signal can be received. The received signal is deconvoluted and integrated created a single value known as an echo. The echoes for a sequence with many wait times maybe stored in a vector or a matrix as long as the indexing and associated time from the first pulse is known. The received data can be stored as a vector or a matrix, and will have an associated time or depth vector or matrix for when the data was taken in relation to a specified event, such as an inversion pulse or an excitation pulse depending on the form of the data. The received data, sometimes referred to as raw data, has many points (or numbers), each point within the data might be referred to as an instance of the received data.

Data has many points (or numbers), each point within the data might be referred to as an instance of the data. Data has many forms depending on how much processing has occurred to the data. Data is acquired by an experiment and is a single set of data or a group of data from a single experiment. The experiment in NMR is referred to as the pulse sequence which results in a set of data which is made of echoes.

The data signals are processed to become processed data. Processed data can be made by as few steps as doing nothing to the data or to having gone through many steps which include but are not exclusive to: filters, averages or inversions. Wherein processed data is made up of several points (or numbers) and as such may be referred to also as a set of processed data or a dataset. The raw data, which is the received data, and until the data has had an inversion applied may be referred to as an echo train.

The system then selects, from the acquired processed data, window of datasets acquired consecutively in time. The window of datasets includes multiple datasets that each have multiple data points. Each data point has a corresponding index count representing a position of that data point from the beginning of the dataset to the end of the dataset. From each dataset, the system collects data points having the same index count and compares them to one another. A minimal, or lowest, data point is then determined from the comparison. Then, for the current index count being analyzed, the corresponding data point in each dataset is recorded as the minimal data point into a new dataset in a new log, thus creating a filtered dataset without the unwanted additional signal. This same process is then completed for the remaining data points at each index count. Once all index positions are compared across datasets and replaced with the corresponding minimal data point, the unwanted additional signal is now filtered from the datasets, thereby resulting in filtered datasets. The system then outputs a downhole log of the filtered datasets.

FIG. 1 shows an illustrative logging while drilling (LWD) environment of the present disclosure. A drilling platform 2 supports a derrick 4 having a traveling block 6 for raising and lowering a drill string 8. A top drive 10 supports and rotates the drill string 8 as the string is lowered through a well head 12. The drill string's rotation (and/or a downhole motor) drives a drill bit 14 to extend the borehole 15 through subsurface earth formations 21. Mud recirculation equipment 16 draws drilling fluid from a retention pit 24 and pumps it through a feed pipe 18 to top drive 10, through the interior of drill string 8 to the drill bit 14, through orifices in the drill bit, through the annulus around drill string 8 to a blowout preventer at the surface, and through a discharge pipe into the pit 24. The drilling fluid transports cuttings from the borehole into the pit 24 and aids in maintaining the borehole integrity.

A nuclear magnetic resonance (NMR) logging tool 26 is integrated into the bottom-hole assembly near the bit 14. The NMR logging tool 26 may take the form of a drill collar, i.e., a thick-walled tubular that provides weight and rigidity to aid the drilling process. As the bit extends the borehole through the formations, the NMR logging tool collects measurements relating to spin relaxation time ($T_1$, $T_2$, $T_p$, and/or $T_2^*$) distributions as a function of depth or position in the borehole. The NMR tool has a magnet, antenna, and supporting electronics. The permanent magnet in the tool causes the nuclear spins to build up into a cohesive magnetization, also sometimes referred to as polarization. The $T_2$ is measured through the decay of excited magnetization while $T_1$ is measured by the buildup of magnetization. Other tools and sensors can also be included in the bottomhole assembly to gather measurements of various drilling parameters such as position, orientation, weight-on-bit, borehole diameter, etc. Control/telemetry module 28 collects data from the various bottomhole assembly instruments (including position and orientation information) and stores them in internal memory, which may be able to store hundreds of hours of data. Selected portions of the data (raw or processed) can be communicated to surface receivers 30 by, e.g., mud pulse telemetry. Other logging—while drilling telemetry methods also exist and could be employed. For example, electromagnetic telemetry or through-wall acoustic telemetry can be employed with an optional repeater 32 to extend the telemetry range. Most telemetry systems also enable commands to be communicated from the surface to the control and telemetry module to configure the operation of the tools.

Figure 2:
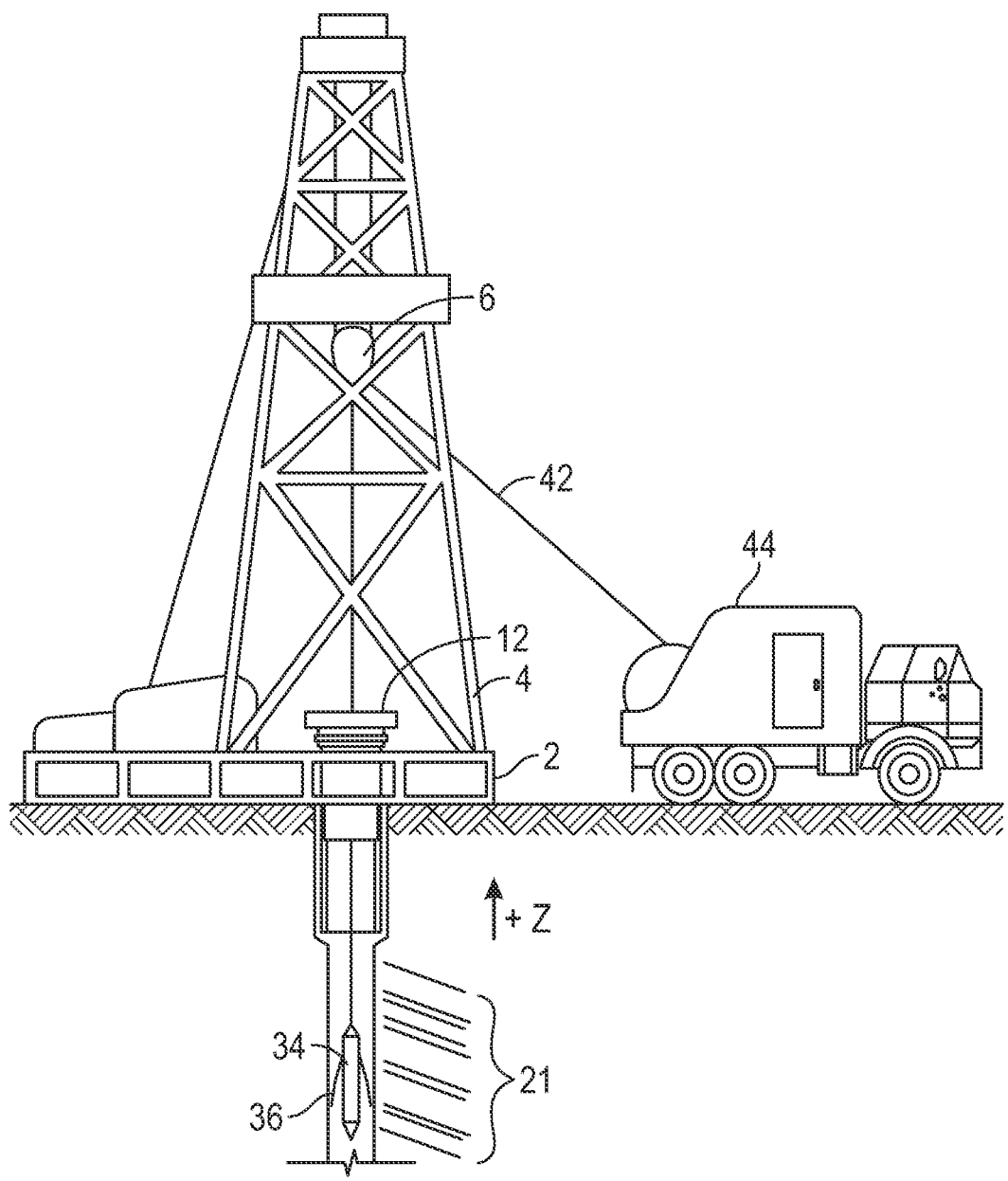
FIG. 2 shows an illustrative wireline logging environment.

FIG. 2 shows an illustrative wireline logging environment. At various times during the drilling process, the drill string 8 may be removed from the borehole as shown in FIG. 2. Once the drill string has been removed, logging operations can be conducted using a wireline logging tool 34, i.e., a sensing instrument sonde suspended by a cable 42 having conductors for transporting power to the tool and telemetry from the tool to the surface. The wireline logging tool 34 may have pads 36 and/or centralizing springs or a decentralizer to maintain the tool in the right position, for example, that could be near the axis of the borehole or against wall, as the tool is pulled uphole. As explained further below, tool 34 can include an NMR logging instrument that collects relaxation time distribution measurements. A logging facility 44 collects measurements from the logging tool 34 and includes a computer system for processing and storing the measurements gathered by the logging tool.

Figure 3:
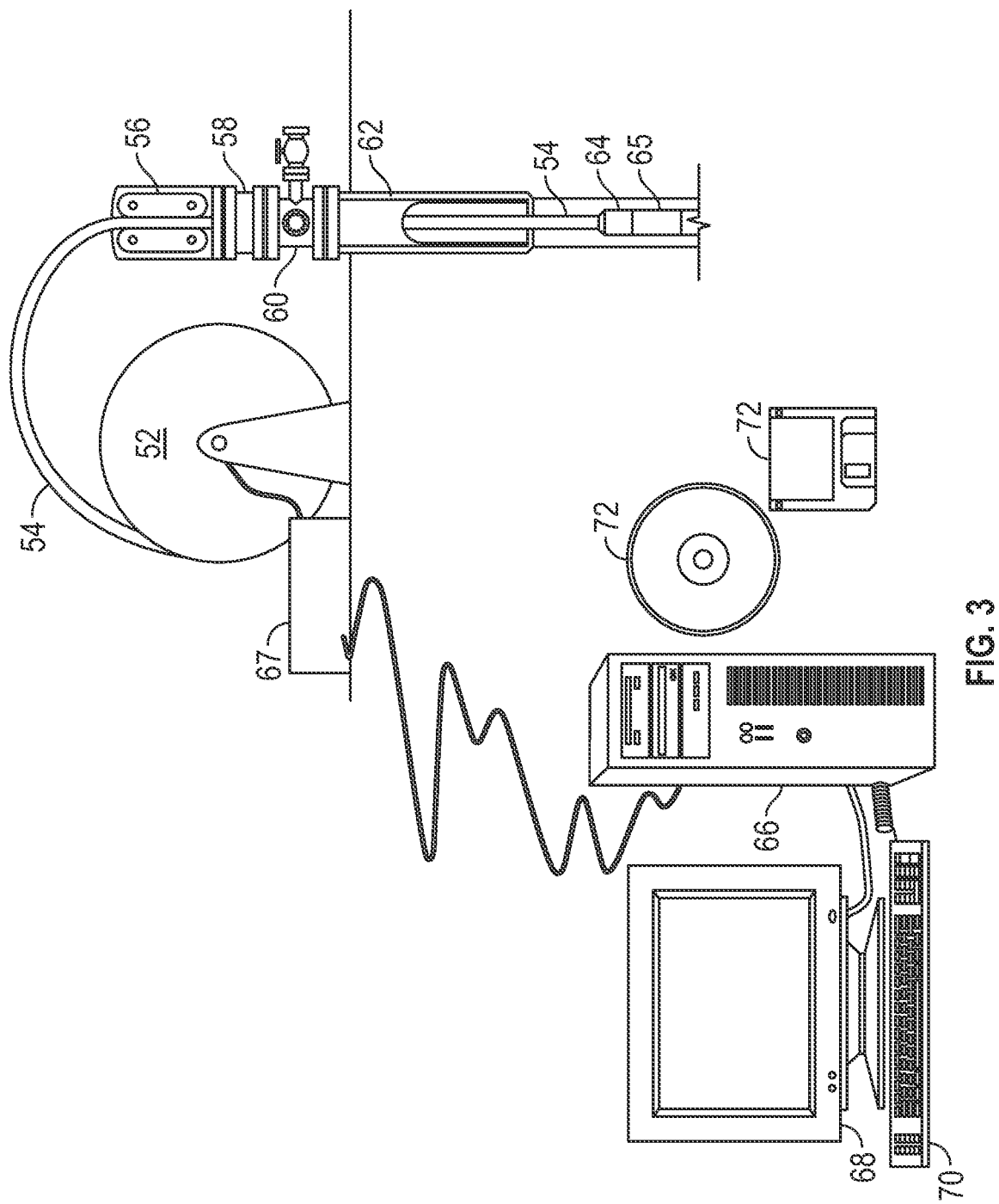
FIG. 3 shows an illustrative coil tubing logging system.

An alternative logging technique is tubing-conveyed logging. FIG. 3 shows an illustrative coil tubing logging system in which coil tubing 54 is pulled from a spool 52 by a tubing injector 56 and injected into a well through a packer 58 and a blowout preventer 60 into the well 62. In the well, a supervisory sub 64 and one or more logging tools 65 are coupled to the coil tubing 54 and configured to communicate to a surface computer system 66 via information conduits or other telemetry channels. An uphole interface 67 may be provided to exchange communications with the supervisory sub and receive data, to be conveyed to the surface computer system 66.

Surface computer system 66 is configured to communicate with supervisory sub 64 to set logging parameters and collect logging information from the one or more logging tools 65 such as an NMR logging tool. Surface computer system 66 is preferably configured by software (shown in FIG. 3 in the form of removable storage media 72) to monitor and control downhole instruments 64, 65. System 66 includes a display device 68 and a user-input device 70 to enable a human operator to interact with the system control software 72.

In each of the foregoing logging environments, the logging tool assemblies preferably include a navigational sensor package that includes direction sensors for determining the inclination angle, the horizontal angle, and the rotational angle (a.k.a. "tool face angle") of the bottom hole assembly. As is commonly defined in the art, the inclination angle is the deviation from vertically downward, the horizontal angle is the angle in a horizontal plane from true North, and the tool face angle is the orientation (rotational about the tool axis) or angle from the high side of the wellbore. In accordance with known techniques, wellbore directional measurements can be made as follows: a three-axis accelerometer measures the earth's gravitational field vector relative to the tool axis and a point on the circumference of the tool called the "tool face scribe line". (The tool face scribe line is typically drawn on the tool surface as a line parallel to the tool axis.) From this measurement, the inclination and tool face angle of the bottom hole assembly can be determined. Additionally, a three-axis magnetometer measures the earth's magnetic field vector in a similar manner. Or gyro sensors can be used to measure angular velocity. From the combined gyro, magnetometer and accelerometer data, the horizontal angle of the bottom hole assembly may be determined. A motion sensing unit can also be included to track the position of the tool. In many cases, the motion sensing unit can derive the position information from the direction sensors.

Figure 4:
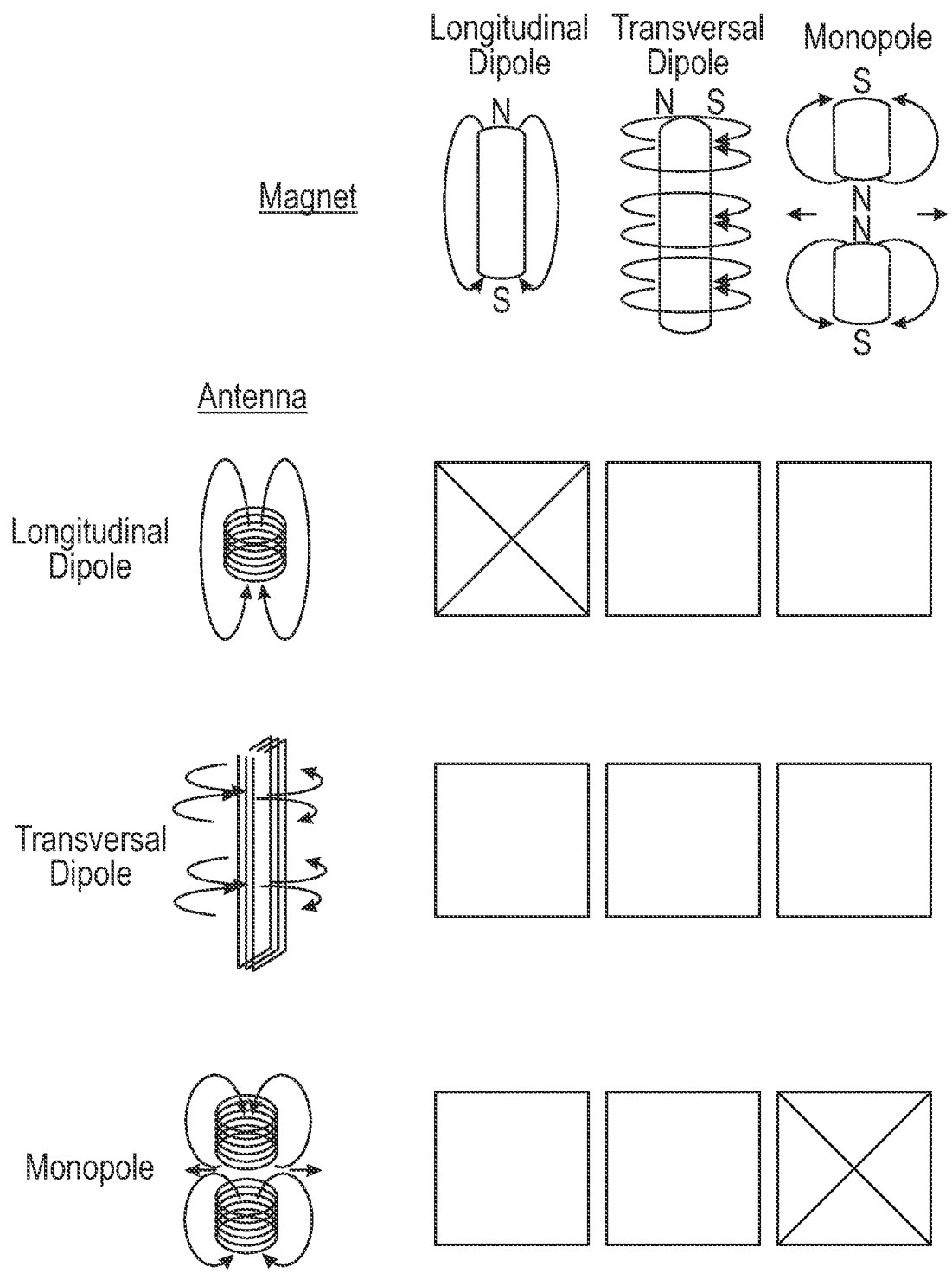
FIG. 4 shows views of illustrative magnet and antenna arrangements for all NMR tool designs.

FIG. 4 shows views of illustrative magnet and antenna arrangements for NMR tool designs. There are many elaborate magnet schemes to create the static magnetic field for down hole logging. The building blocks for all of these schemes are the basic available magnetic field dimensional possibilities, as shown in FIG. 4: longitudinal dipole, transversal dipole, and monopole. These three building blocks can be used for the antenna and the magnet. Different combinations of these basic fields will create different sensitivities to the signal. The creation of shaped static magnetic fields, $B_0$ and the associated antenna field, $B_1$ which is best suited for an NMR experiment, is different depending on the intended application for the NMR tool. For instance, for a drilling environment, axial symmetric or nearly axial symmetric magnet field designs are considered preferable. The creation of these magnet fields may include a magnet which is composed of many pieces of magnet. The direction of those magnets may vary from axial to transversal, or even in a monopole direction, where the direction of the material is radial outward, or a combination thereof. The magnet maybe created using magnet sections grouped together and placed at carefully designed spacings to get the desired magnetic field shape. Magnets in opposing magnetic direction to the other magnets in the main configuration maybe placed to stretch, weaken, change the gradient, or shape the field. The magnet and antenna fields maybe be created also with the addition of magnetically permeable material. The location of the magnetic permeable material is not limited to under the antenna, where being "under the antenna" means closer to the center of the tool radially than the antenna, but in most configurations, there will be some magnetically permeable material under the antenna. The antenna may be placed directly adjacent to the permeable magnetic material or have a specific spacing between the antenna and the material.

Magnet/antenna configurations may be created that have more than one sensitive volume. The sensitive volume is the volume from which NMR signal will be observed. Magnet/antenna configurations may be created that use more than one antenna. The additional antenna may be used to collect data from the more than one volumes. However, in some cases a second antenna will collect data from the same sensitive volume. A third antenna might even be used to collect data from the same sensitive volume for select combinations. In the case where more than one antenna collects data from the same sensitive volume it is best if those antennas are orthogonal.

Combinations like monopole magnet with longitudinal dipole antenna, transversal dipole magnet with transversal dipole antenna, and longitudinal dipole magnet with transversal dipole antenna create round enough magnetic fields to be used in a downhole drilling environment, as indicated in a combination matrix shown in FIG. 4. The only combinations which are not used because the signal will be practically zero are longitudinal dipole magnets with longitudinal dipole antennas and monopole magnets with monopole antennas, as indicated by X's in the combination matrix.

Figure 5A:
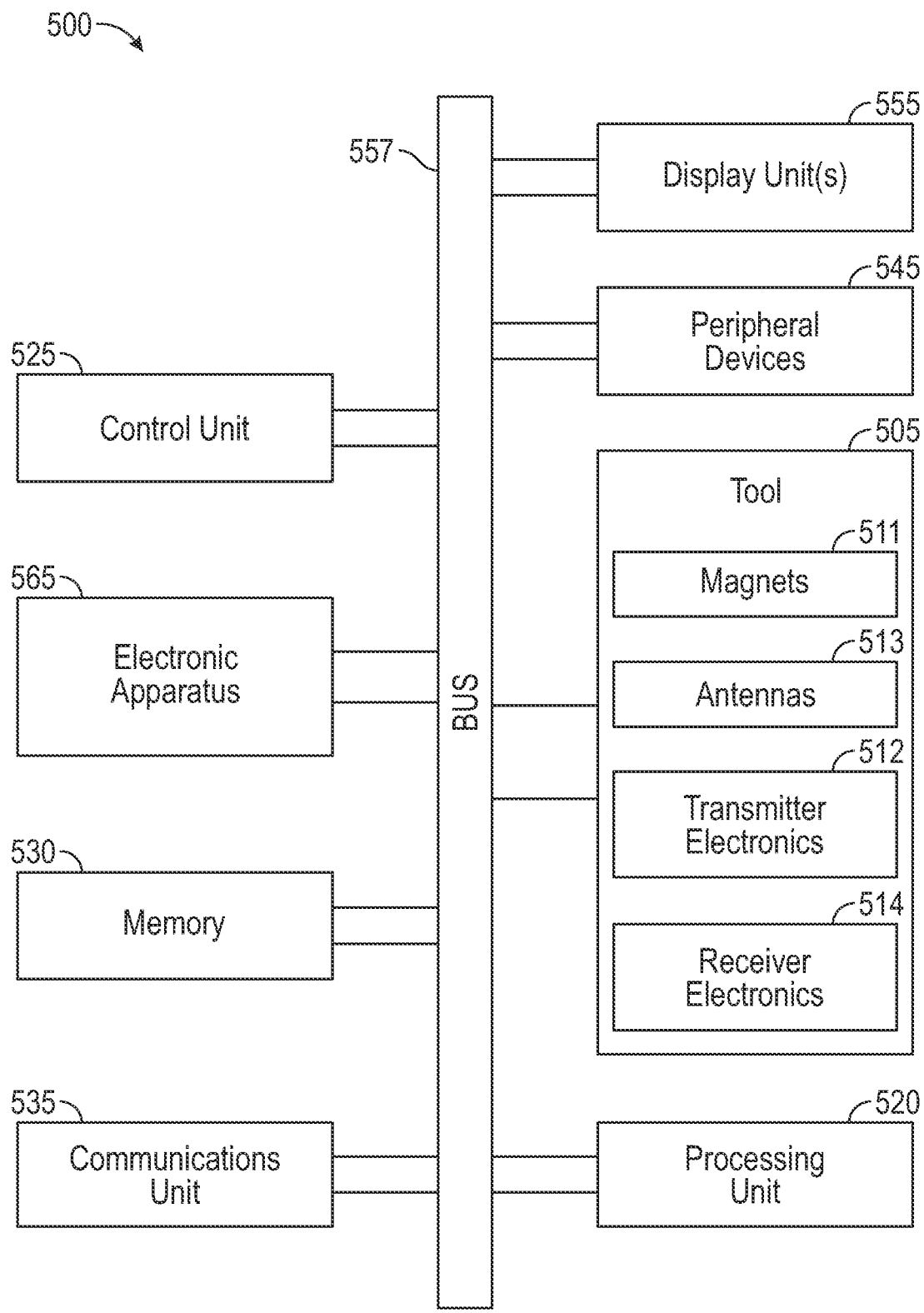
FIG. 5A is a block diagram of features of an example embodiment of a system operable to process nuclear magnetic resonance data and prepare for sending uphole.

FIG. 5A is a block diagram of features of an example embodiment of a system operable to process nuclear magnetic resonance data which is less demanding to send uphole from an NMR logging tool 505, as described herein or in a similar manner. The system 500 can include the NMR tool 505 having an arrangement of magnets 511, antenna(s) 513, transmitter electronics 512, and receiver electronics 514. The system 500 can be configured to operate in accordance with the teachings herein.

The system 500 can include a control unit 525, a memory 530, an electronic apparatus 565, and a communications unit 535. The memory 530 can be structured to include a database. The control unit 525, the memory 530, and the communications unit 535 can be arranged to operate as a processing unit to control operation of the transmitter electronics 512 and the receiver electronics 514 and to perform operations on the signals collected by the receiver electronics 514 to process nuclear magnetic resonance data generated by the NMR logging tool 505. A processing unit 520, structured to process nuclear magnetic resonance data of the NMR logging tool 505, can be implemented as a single unit or distributed among the components of the system 500 including electronic apparatus 565. The control unit 525 and the memory 530 can operate to control activation of the transmitter electronics 512 to generate echo train sequences and recovery pulses. The control unit 525 and the memory 530 can operate to control selection of the receiver electronics 514 in the tool 505 and to manage processing schemes. The control unit 525, the memory 530, and other components of the system 500 can be structured, for example, to operate similar to or identical to the components discussed herein or similar to or identical to any of methods discussed herein.

The system 500 can also include a bus 557, where the bus 557 provides electrical conductivity among the components of the system 500. The bus 557 can include an address bus, a data bus, and a control bus, each independently configured or in an integrated format. The bus 557 can be realized using a number of different communication mediums that allows for the distribution of components of the system 500. Use of the bus 557 can be regulated by the control unit 525. Bus 557 can include a communications network.

In various embodiments, the peripheral devices 545 can include additional storage memory and other control devices that may operate in conjunction with the control unit 525 and the memory 530. In an embodiment, the control unit 525 can be realized as a processor or a group of processors that may operate independently depending on an assigned function. The system 500 can include display unit(s) 555, which can be used with instructions stored in the memory 530 to implement a user interface to monitor the operation of the tool 505 or components distributed within the system 500.

The components shown in FIG. 5A need not be distributed as shown. Some of the components may be located on the surface, some in the tool 505, some in other locations in the drill string 8, wireline logging tool 34, logging tools 65, or some other location in the systems illustrated in FIGS. 1, 2, and 3, and some may be distributed among those locations.

Figure 5B:
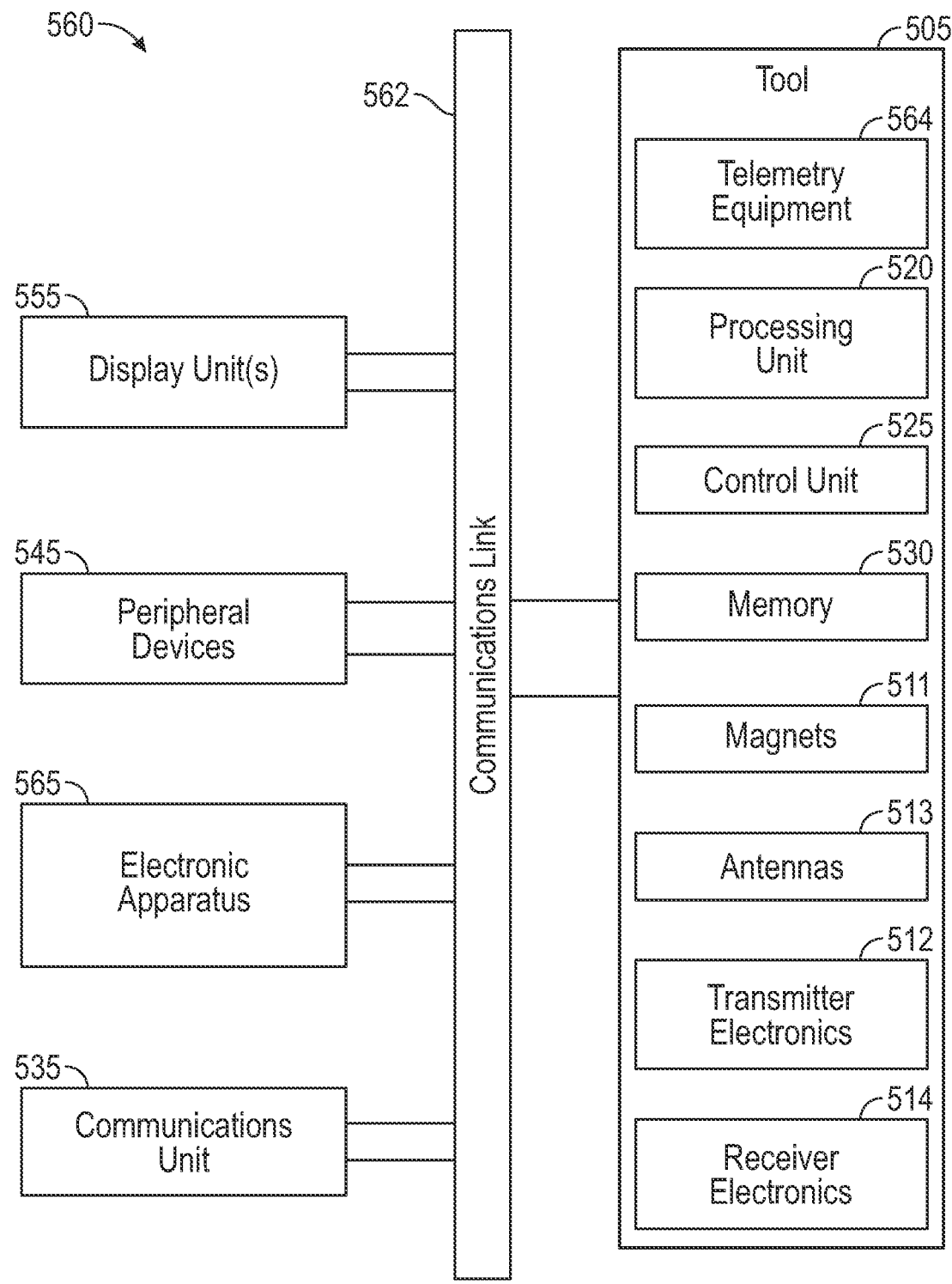
FIG. 5B is a block diagram of features of an example embodiment of a system operable to process nuclear magnetic resonance data.

FIG. 5B is block diagram of features of another example embodiment of a system operable to process nuclear magnetic resonance data of an NMR logging tool, as described herein or in a similar manner. In the system 560 illustrated in FIG. 5B, the processing unit 520, the control unit 525, and the memory 530 are located in the tool 505. The components in the tool 505 communicate via a communications link 562 using telemetry equipment 564 to communicate with, for example, the communications unit 535.

Figure 6:
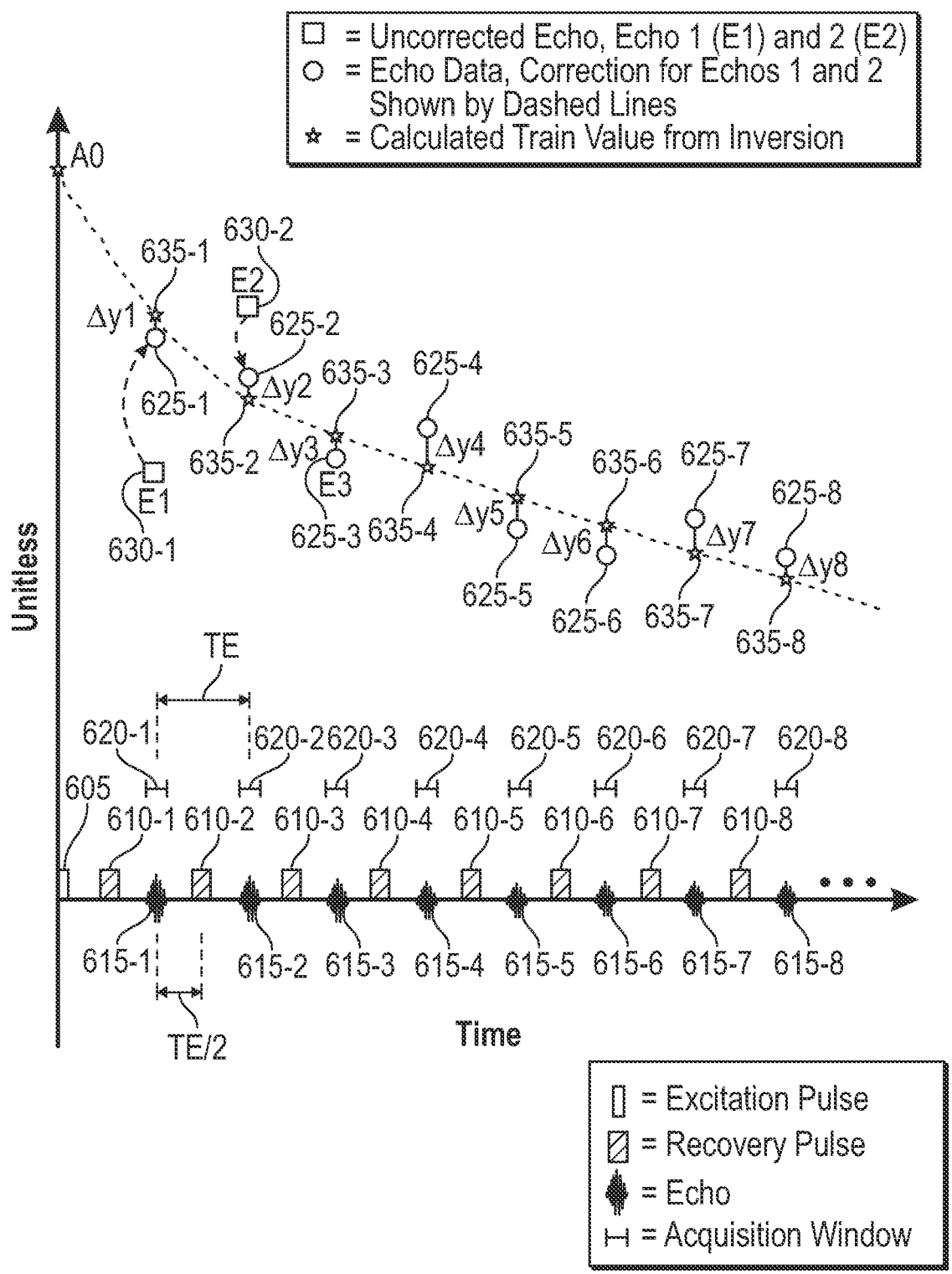
FIG. 6 is a representation of a CPMG sequence.

FIG. 6 is a representation of a CPMG sequence. FIG. 6 illustrates an excitation pulse 605 and a sequence of recovery pulses 610-1, 610-2, . . . , 610-8. In this non-limiting example sequence, eight recovery pulses 610-1, 610-2, . . . , 610-8 cause eight echoes 615-1, 615-2, . . . , 615-8, where the peak amplitudes of the echoes are equally spaced apart by a peak to peak time distance, TE (echo time), that corresponds to the equally spaced apart time distances of the recovery pulses. Recovery pulses are not limited to eight pulses, but the number used may depend on the application and/or measurement parameters. Also indicated are acquisition windows 620-1, 620-2, . . . , 620-8 for capturing the signal of an echo, a first echo $E_1$, a second echo $E_2$, and a third echo $E_3$. A0 is the amplitude of the echo train at time zero. A0 is not measured but is calculated by using an exponential decay fitting curve determined from the third echo $E_3$ to the last echo. $E_1$ and $E_2$ can be included if they are corrected. These echoes decay according to the $T_2$ of the medium. Magnetization will be allowed to recover fully or partially for the next sequence, then a medium can be probed again by another sequence.

A $T_1$ experiment downhole consists of a flipping or nulling of the magnetization in the positive z direction through an inversion, excitation, or saturation pulse followed by a CPGM sequence. The time between the saturation pulse and the CPMG sequence, designated as wait time (WT), is varied in the r (time) domain. This allows for the built up magnetization in the z-axis to be measured. Any number of wait times can be used ranging from a minimum of 2 to a practical limit of about 100; for example, in practice, a minimum of 3 is used. There is no upper limit on how many WTs can be used; however, it is preferred to keep the number lower so that the vertical resolution of the data is kept minimal, battery life is extended or the tool is run on batteries, processing power downhole is usable, and stress on electronics is minimal.

Figure 7:
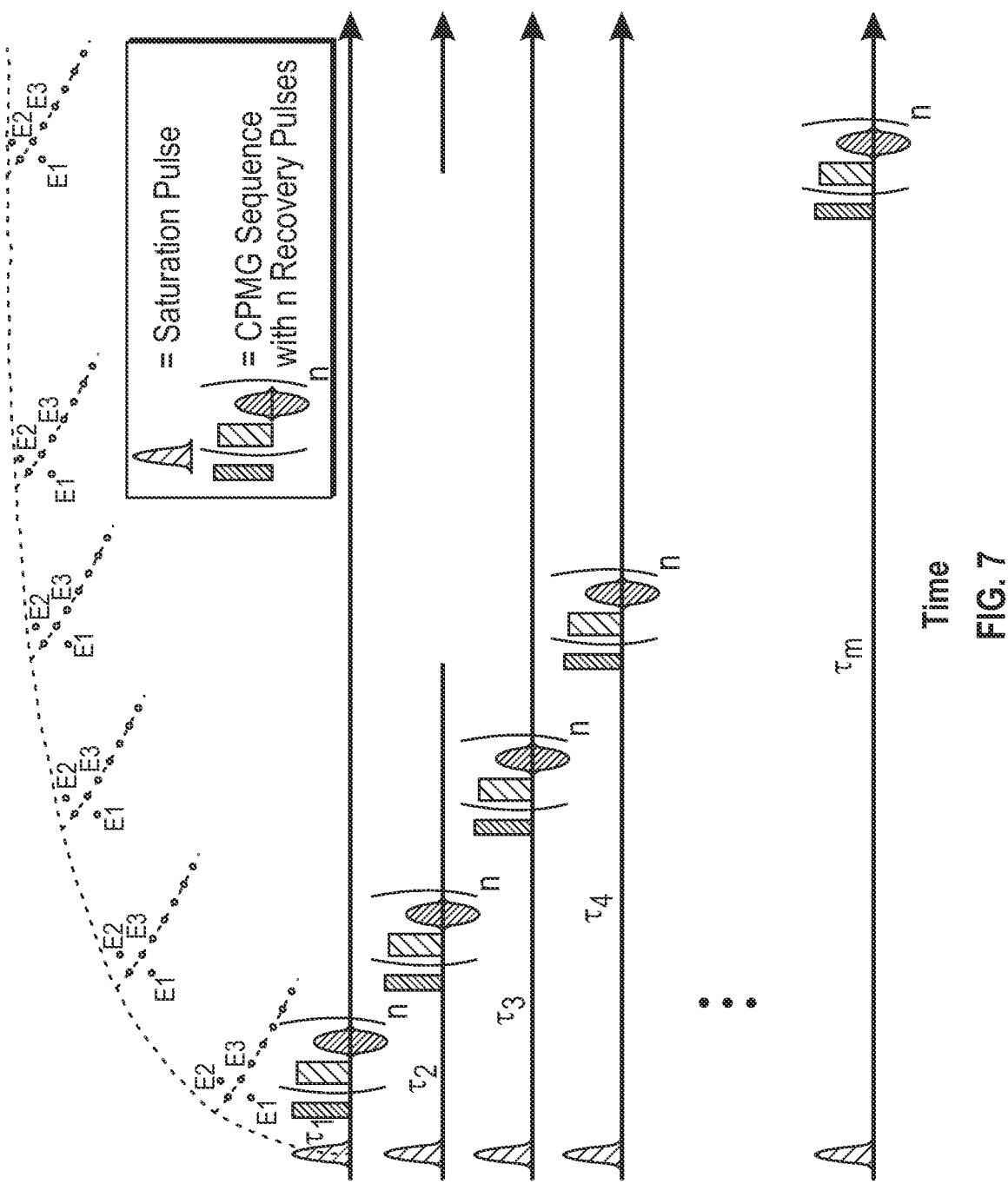
FIG. 7 is a diagram of a $T_1$ experiment.

FIG. 7 is a diagram of a $T_1$ experiment. The individual CPMGs for each WT can have any number of echoes. The WTs in FIG. 7 are as shown as $\tau_1, \tau_2, \ldots, \tau_m$. Commonly, the longest wait time can have a significantly larger number of echoes taken. Lower WTs do not need as many echoes as less magnetization has recovered and the data decays into the noise quickly.

The values in the echo train measurement 625-1, 625-2, ..., 615-8, $Y_{result}$, are shown as solid circles immediately above or below their respective echoes in FIG. 6. The initial values calculated for echo 1 (shown as solid square 630-1) and echo 2 (shown as solid square 630-2) are corrected as indicated by the dashed arrows, to result in echo train measurements 625-1 and 625-2.

The NMR tool acquires echoes based on the pulse sequence used, here this data is designated as S(t). To interpret the data, S(t) is inverted into a different basis: $T_2$ (i.e., transverse relaxation), $T_1$ (i.e., longitudinal recover time), or D (i.e., diffusion). The inversion produces spectrum components which are correlated to a time ($T_1$ or $T_2$) or diffusion axis. The spectrum can then be used to make petro-physical conclusions about the formation. To perform this inversion, the data is fit to known answers.

$$S(t) = \sum_{uvh} x_{uv} \cdot A(T_{1u}, T_{2v}, D_h, t) \quad (1)$$

When the tool is stationary, the signal's known answer, omitting surface/volume interaction, depends on each wait time, diffusion coefficient, gradient, the time of the echo, $T_1$, $T_2$, and the TE. The signal from the tool only occurs with each echo and not a continuum of time and is referred to as y(n). The signal for the nth echo for the kth wait time and for the sth TE has the form:

$$y^{k,s}(n) = \sum_{h=1}^{r}\sum_{v=1}^{q}\sum_{u=1}^{p} x_{hvu} \cdot \left(1 - e^{-\frac{TW_k}{T_{1u}}}\right) \cdot e^{-\frac{t_n}{T_{2v}}} \cdot e^{\frac{D_h(\gamma \cdot G_b \cdot TE_s)^2 \cdot t_n}{12}} \quad (2)$$

where:
$y^{k,s}(n)$ is the nth echo for the kth wait time for the sth TE,
q is the total number of $T_2$ components,
p is the total number of $T_1$ components,
r is the number of diffusion constants,
n is the count of the echo in a single wait time,
s is the number of the TEs,
$x_{111} \ldots x_{pqr}$ are the amplitudes of the respective spectrum components,
$TW_k$ is the kth wait time,
$T_{21} \ldots T_{2q}$ are the $T_2$ time constants for each of the q factors,
$T_{11} \ldots T_{1p}$ are the $T_1$ time constants for each of the p factors,
$TE_s$ is the sth inter-echo time,
$t_n$ is the time when the nth echo is acquired,
$D_h$ is the hth diffusion constant,
$\gamma$ is the gyromagnetic ratio, and
$G_b$ is the average gradient for a single band b.

While equation (2) includes small assumptions, in practice equation (2) is easier to use if simplified. The exact simplification used may vary based on the parameter targeted. Common simplifications for equation (2) use a ratio between $T_1$ and $T_2$, only a single TE, assume a single Gradient (G), and assume a constant diffusion (D).

$$y^k(n) = \sum_{i=1}^{p} x_i \cdot \left(1 - e^{-\frac{TW_k}{T_{1i}}}\right) \cdot e^{-\frac{n \cdot TE}{T_{2i}}} \cdot e^{\frac{D(\gamma \cdot G \cdot TE)^2 \cdot n \cdot TE}{12}} \quad (3)$$

where:
$y^k(n)$ is the nth echo for the kth wait time,
p is the total number of $T_1$ components, $T_1$ components are also known as bins,
$x_1 \ldots x_p$ are the amplitudes of the respective spectrum components,
$TW_k$ is the kth wait time,
$T_{11} \ldots T_{1p}$ are the $T_1$ time constants for each of the p factors,
$T_{21} \ldots T_{2p}$ are the $T_2$ time constants for each of the p factors (note that to eliminate the j dimension of the x matrix in equation (1) and thereby simplify equation (2), $T_{2j}$ is assumed to be proportional to $T_{1i}$ so that $T_{2j} \alpha T_{1i}$ for all i and j for a particular wait time $TW_k$ and $T_{2j}$ is renamed $T_{2i}$),
TE is the inter-echo time (note that, to simplify equation (2), only one inter-echo time is assumed),
D is the diffusion constant,
$\gamma$ is the gyromagnetic ratio, and
G is the gradient.

Now equation (1) simplifies likewise to:

$$S(t) = \sum_{i} x_i \cdot A(T_{1i}, T_{2i}, t) \quad (1A)$$

The signal can be connoted in many ways. A simple way to handle the dataset is to form it into a simple vector where one wait time's echoes are followed by the next wait time's echoes. Equation (3) can be used to expand equation (1A) to form a matrix dataset of known results for all wait times and echoes as below:

$$\begin{matrix} TW_1 \\ \\ \\ \\ TW_2 \\ \\ \\ \\ \ldots \\ \\ TW_m \end{matrix} \begin{bmatrix} y^1(1) \\ y^1(2) \\ \ldots \\ y^1(n_1) \\ y^2(1) \\ y^2(2) \\ \ldots \\ y^2(n_2) \\ \ldots \\ y^m(1) \\ y^m(2) \\ \ldots \\ y^m(n_m) \end{bmatrix} = \begin{bmatrix} A_{11}^1 & A_{21}^1 & \ldots & A_{p1}^1 \\ A_{12}^1 & A_{22}^1 & \ldots & A_{p2}^1 \\ \ldots & \ldots & \ldots & \ldots \\ A_{1n_1}^1 & A_{2n_1}^1 & \ldots & A_{pn_1}^1 \\ A_{11}^2 & A_{21}^2 & \ldots & A_{p1}^2 \\ A_{12}^2 & A_{22}^2 & \ldots & A_{p2}^2 \\ \ldots & \ldots & \ldots & \ldots \\ A_{1n_2}^2 & A_{2n_2}^2 & \ldots & A_{pn_2}^2 \\ \ldots & \ldots & \ldots & \ldots \\ A_{11}^m & A_{21}^m & \ldots & A_{p1}^m \\ A_{12}^m & A_{22}^m & \ldots & A_{p2}^m \\ \ldots & \ldots & \ldots & \ldots \\ A_{1n_m}^m & A_{2n_m}^m & \ldots & A_{pn_m}^m \end{bmatrix} \begin{bmatrix} x_1 \\ x_2 \\ \ldots \\ x_p \end{bmatrix} \quad (4)$$

Where
m is the total number of WTs,
$A_{ij}^k = A_{T2\ bin, echo\ number}^{WT\ number}$ is a basis function that can be used to invert the data into the $T_1$ or $T_2$ time domains, and
j is the count of echoes in a sequence of wait times.

For an average gradient and single TE:

$$A_{ij}^k = \tag{5A}$$

$$A_{T2\ bin,\ echo\ number}^{WT\ number} = \left(1 - e^{-\frac{TW_k}{T_{1i}}}\right) \cdot e^{-\frac{j \cdot TE}{T_{2i}}} \cdot e^{-\frac{D(\gamma \cdot G \cdot TE)^2 \cdot n \cdot TE}{12}}$$

Equation (5A) is a basis function that can be used to invert the data into the $T_1$ or $T_2$ time domain with the coefficients being used as a spectrum in those domains. Other basis functions are possible.

For example, a basis function may only involve $T_2$. In the case where only a single WT is used and only a $T_2$ inversion is being done, a basis function that can be inverted to determine $T_2$ only may be:

$$A_{ij}^k = e^{-\frac{j \cdot TE}{T_{2i}}} \cdot e^{-\frac{D(\gamma \cdot G \cdot TE)^2 \cdot n \cdot TE}{12}} \tag{5B}$$

Further, the basis function is not limited to exponentials. A may be approximated linearly, such as that shown in Equation (5C):

$$A_{ij}^k = \left(1 - \frac{j \cdot TE}{T_{2i}}\right) \cdot e^{-\frac{D(\gamma \cdot G \cdot TE)^2 \cdot j \cdot TE}{12}} \tag{5C}$$

A may be approximated quadratically, such as that shown in Equation (5D):

$$A_{ij}^k = \left(1 - \frac{j \cdot TE}{T_{2i}} - \frac{1}{2}\left(\frac{j \cdot TE}{T_{2i}}\right)^2\right) \cdot e^{-\frac{D(\gamma \cdot G \cdot TE)^2 \cdot j \cdot TE}{12}} \tag{5D}$$

or A may be approximated with a higher order approximation.

In another example there are circumstances where assuming a ratio between $T_1$ and $T_2$ cannot not be used. Such is the case in a circumstance where a $T_1/T_2$ simultaneous inversion for a $T_1/T_2$ map needs to be created. A basis function may created without assumptions about the ratio between $T_1$ and $T_2$ for a $T_1/T_2$ simultaneous inversion for a single TE, such as that shown in equation (5E).

$$A_{uvj}^k = \left(1 - e^{-\frac{TW_k}{T_{1u}}}\right) \cdot e^{-\frac{t_j}{T_{2v}}} \cdot e^{-\frac{D(\gamma \cdot G \cdot TE)^2 \cdot j \cdot TE}{12}} \tag{5E}$$

This basis function has more dimensions than those previously shown and the A basis is now a 3 dimensional matrix. In this circumstance equation (2) is used to expand equation (1) for the inversion.

The above equation (4) can be shortened as:

$$Y = AX \tag{6-1}$$

where:

$$Y = \begin{bmatrix} y^1(1) \\ y^1(2) \\ \cdots \\ y^1(n_1) \\ y^2(1) \\ y^2(2) \\ \cdots \\ y^2(n_2) \\ \cdots \\ y^m(1) \\ y^m(2) \\ \cdots \\ y^m(n_m) \end{bmatrix}, \tag{6-1a}$$

$$A = \begin{bmatrix} A_{11}^1 & A_{21}^1 & \cdots & A_{p1}^1 \\ A_{12}^1 & A_{22}^1 & \cdots & A_{p2}^1 \\ \cdots & \cdots & \cdots & \cdots \\ A_{1n_1}^1 & A_{2n_1}^1 & \cdots & A_{pn_1}^1 \\ A_{11}^2 & A_{21}^2 & \cdots & A_{p1}^2 \\ A_{12}^2 & A_{22}^2 & \cdots & A_{p2}^2 \\ \cdots & \cdots & \cdots & \cdots \\ A_{1n_2}^2 & A_{2n_2}^2 & \cdots & A_{pn_2}^2 \\ \cdots & \cdots & \cdots & \cdots \\ A_{11}^m & A_{21}^m & \cdots & A_{p1}^m \\ A_{12}^m & A_{22}^m & \cdots & A_{p2}^m \\ \cdots & \cdots & \cdots & \cdots \\ A_{1n_m}^m & A_{2n_m}^m & \cdots & A_{pn_m}^m \end{bmatrix}, \tag{6-1b}$$

$$X = \begin{bmatrix} x_1 \\ x_2 \\ x_3 \\ \cdots \\ x_p \end{bmatrix}, \text{ and} \tag{6-1c}$$

The A matrix dataset shown above can be two dimensional or three dimensional.

Generally, Y is a vector dataset of echoes taken in a sequence called an "activation." The A matrix is the basis function matrix created to fit the data. And X is the vector of coefficients which minimize the difference between the data and basis function. X is also a vector of coefficients which create the spectrum when plotted against the T1, T2, or D basis axis The spectrum vector X is given by:

$$X = A^{-1}Y \tag{6-2}$$

When the NMR tool is moving at a speed v, the stationary equations above no longer apply. A taking into account the moving speed is A(v). The corresponding Y is Y(v). X remains the same because X is an intrinsic property of the formation. There are many factors in the echo train that can change while in motion. There is the polarization of the $T_1$, captured in a $T_1$ sequence. There is the decay of the echo train captured by a CPMG, or CPMG derived sequence. There are inflicted phases that are similar to a diffusion measurement, captured by doing a diffusion editing like sequence. However, in an adiabatic condition these phases may not be observed.

When the tool is in motion, equation (6-1) can be rewritten as:

$$Y(v) = A(v)X \tag{7-1}$$

The inversion can be done using the equation (7-1) producing a solution as in equation (7-2):

$$X = A(v)^{-1} Y(v) \quad (7\text{-}2)$$

If the inverse of the stationary matrix A is used in equation (7-2), the result is:

$$X^* = A^{-1} Y(v) = A^{-1} A(v) X \quad (7\text{-}3)$$

In this method, X is not found directly during the inversion and a correction needs to be done. Since A(v) is different from the stationary A due to $B_0$ inhomogeneity, A-IA(v) is not equal to the unit matrix I, which means that X* is not the same as X. In other words, if the stationary matrix A is used with data collected with the NMR tool is moving, an error is created. This is called motion effect.

Consider corrections to X*. The term X* can be corrected by the following equation:

$$X = A(v)^{-1} A X^* \quad (8)$$

where $A(v)^{-1} A$ is called the motion correction matrix.

The term A can be calculated directly. As shown above, constructing the A(v) matrix under non-zero speed is a key to removing motion effect. Correct inversion can be achieved either by using A(v) (motion dependent) in inversion or by using the stationary A and then correcting as in equation (8).

As discussed above, the column vector in A(v), Vector $A_i^k$ (equation 6-1e), is the combined echo trains with all recovery times $TW_1$, $TW_2$, ... and $TW_m$, but the same $T_1$ time constant and $T_2$ time constant for each recovery time. If $B_0$ is known, the A(v) matrix can be calculated either analytically or through simulation. Because A(v) is a function of speed and $T_1/T_2$ values, the combination of a different speed and different $T_1/T_2$ value is big, the amount of computation is huge. One way to reduce computation is to decrease the number of different speeds but interpolate/extrapolate to correct speed. Another technique is to adjust the number of $T_1/T_2$ components (bins).

To calculate A(v) correctly is not a simple matter. A simplification can be made where a simple cylinder shape is considered for the volume. In this case analytical equations can be created for the $T_2$ echo losses in A(v) such as:

$$A(v) = (1 - ROP * n * TE) * s(t)$$

With the complex shapes of the magnetic field, the correct A(v) does not have a simple analytical form. One way of creating A(v) more accurately includes procedures to simulate the echo train completely mathematically using the knowledge of $B_0$ and $B_1$. Because this calculation is time consuming, one set of A(v) can be been made using the theoretically perfect $B_0$ and $B_1$, instead of by measuring the field from each real logging tool with a Gauss meter and creating A(v) for each tool.

The magnetic and rf fields can be meshed into small voxels, where each voxel has a $B_0$, $B_1$, and an amount of micro magnetization. A finer mesh provides more accurate echo trains, however, becomes more and more computationally challenging. The tool's response, emf, from any voxel, as in the gridded space of FIG. 10 (discussed below), can be calculated using the principle of reciprocity, as outlined in Hoult, D., 2000, The principle of reciprocity in signal strength calculations—A mathematical guide: Concepts of Magnetic Resonance, 12, (4), 173-187. Then, the micro magnetizations are followed through time using the Bloch equation or rotation matrices. In this way, different A(v) can be found for different ROPs and $T_1$.

$$A(v, T1, ROP) \propto \int \int \int^V \text{micro magnetization } (t, T1, ROP) dx\, dy\, dz \quad (9)$$

Figure 8:
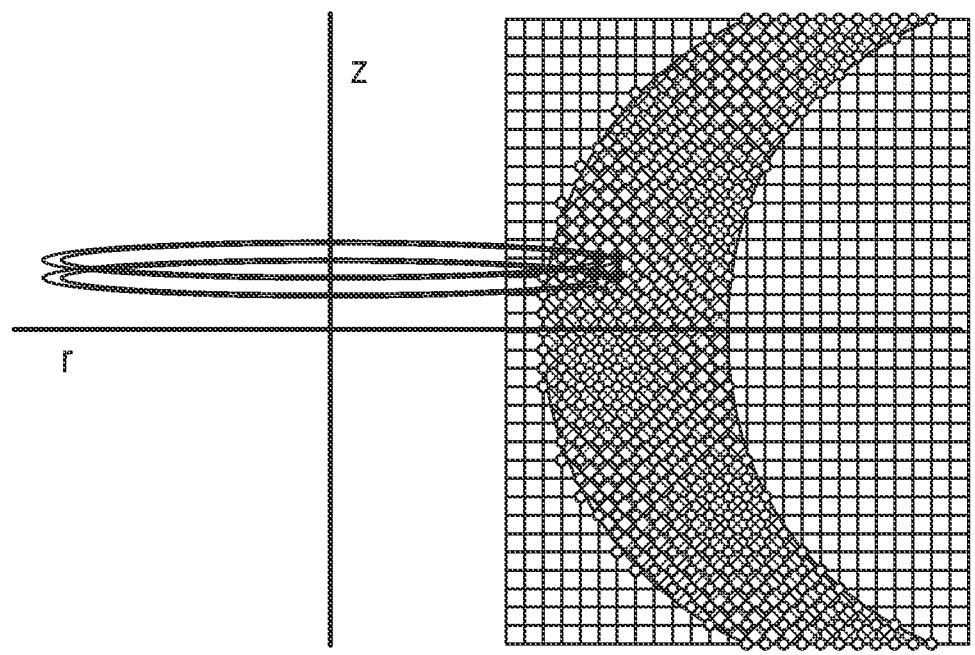
FIG. 8 is a pictorial of a selected sensitive region in a magnetic field.
Figure 9:
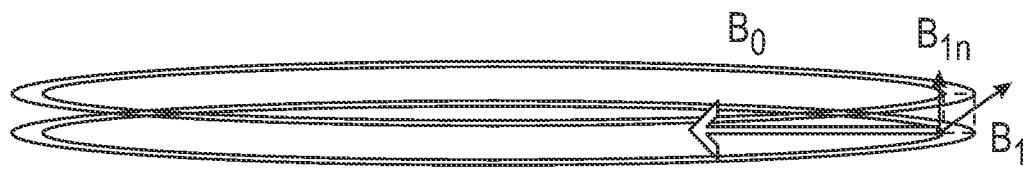
FIG. 9 is a representation of a rotationally symmetric voxel.

FIG. 8 is a pictorial of a selected sensitive region in a magnetic field. This field is split into many voxels. At each voxel a micro magnetization, uses the time dependent $B_1$ and the $B_0$ to calculate a signal for a specific time. That micro magnetization is rotated using excitation and refocusing pulses at specific times to obtain a theoretical echo train. FIG. 9 is a representation of a rotationally symmetric voxel. This allows a simplification in the calculation to go from 3D to 2D using the annulus volume.

In certain illustrative methods, creating the A(v) can be performed using the following steps. First, a zero ROP emf, where the emf is a stimulated signal picked up in the coil which created the $B_1$, is found just as a calibration would be performed on the tool. This allows to rescale the A(v) into the units of porosity instead of in voltage units.

For non-zero ROP calculations, it is simplest to use the tool as a reference frame, that is, as if the tool were stationary and the formation continually moving, however the opposite can also be done. In this case, the magnetization field is moved in relation to the $B_0$ and $B_1$ fields at the ROP. The magnetization, M(t), is a function of speed v, $T_2$ decay, $T_1$ recovery time, $B_0$, and $B_1$. A steady state micro magnetization vector is created for each volume with the micro magnetization aligned with $B_0$. The direction of $B_0$ in each voxel can be designated as: $\hat{z} = [0\ 0\ 1]$. For a motion along the tool, the calculation is in the adiabatic case, and the Barry phase is not an issue. However, if calculating for other motions such as the vibrational plane the Barry phase should be accounted for or smaller voxels and time increments used.

The sensitive volume is then selected from the $B_0$ field using the tool operating frequency and pulse duration or Fourier transformation of a realistic pulse. The saturation/inversion pulse is used to null/invert the magnetization in that sensitive volume. Typically, a saturation/inversion pulse can have a bandwidth between ±3 to ±10% of the tool's operating frequency. It generally will be larger than the excitation pulse's bandwidth. If only a $T_2$ sequence in motion is to be calculated there would be no saturation/inversion pulse.

The micro magnetization is then allowed to recover for a total time equaling the wait time. Recovery occurs in small time increments, $\Delta t$, using the following equation:

$$M_{t_{i+1}} = (M_{t_i} + (\chi B_0 - M_{t_i}))(1 - e^{-\Delta t/T_1})\hat{z} \quad (10)$$

where M is the micro magnetization to be integrated over, and $\hat{z}$ is the unit vector in the direction of local z, and $\chi$ is the magnetic susceptibility.

The excitation can be performed with or without considering the pulse width. Without considering the pulse shape and timing, the pulse is computed as an instantaneous event. More complex considerations of the pulse can be done, however, for simplicity only this one is discussed. The excitation pulse can be done with any phase. The refocusing pulse then is best when it is shifted 90⁰ out of phase from the excitation pulse. For example, the excitation pulse could be along the "x" axis, while the refocusing pulse is along the "y" axis. The micro magnetization vector is then rotated using the rotation matrix. For the case of an "x" pulse $$R_x(\theta) = \begin{bmatrix} 1 & 0 & 0 \\ 0 & \cos\theta_{tipE} & -\sin\theta_{tipE} \\ 0 & \sin\theta_{tipE} & \cos\theta_{tipE} \end{bmatrix} \quad (11)$$

The tipping angle, $\theta_{tipE}$, for each voxel is determined using the strength of $B_1$ perpendicular to $B_0$, $B_{1n}$, at the voxel's location:

$$\theta_{tipE} = \pi \gamma B_{1n} \tau_{excitation} \quad (12)$$

Where $\gamma$ is the gyromagnetic ratio and $\tau_{excitation}$ is the duration of the excitation pulse.

Following the excitation pulse, the micro magnetization is allowed to precess freely around the static field for ½ TE, where TE is the echo time. From the Bloch equation, it is known that magnetization undergoes a precession under the influence of a magnetic field, which can be simply represented as a rotation:

$$R_z(\theta) = \begin{bmatrix} \cos\theta_{FID} & -\sin\theta_{FID} & 0 \\ \sin\theta_{FID} & \cos\theta_{FID} & 0 \\ 0 & 0 & 1 \end{bmatrix} \quad (13)$$

During this time, the magnetization is still recovering by means of equation (12). So, the rotation also performed in small time increments, $$\theta_{FID} = 2\pi \gamma B_0 \Delta t$$

until a total time of ½ TE has passed.

During the free induction decay (FID), it is easy to assess that magnetization spreads within a couple hundred microseconds to the point where no signal would be measured, making the reason for a recovery pulse obvious.

The first step to recovering the magnetization is to perform a pulse, which will flip the fast and slow spins' phases. Ideally, this would be a 180° pulse; but, as with the excitation pulse, the exact rotation each voxel undergoes will be dependent on the $B_{1n}$.

$$R_y(\theta) = \begin{bmatrix} \cos\theta_{tipR} & 0 & \sin\theta_{tipR} \\ 0 & 1 & 0 \\ -\sin\theta_{tipR} & 0 & \cos\theta_{tipR} \end{bmatrix} \quad (14)$$

where:

$$\theta_{tipR} = \pi \gamma B_{1n} \tau_{recovery}. \quad (14\text{-}1)$$

Where $\tau_{recovery}$ is the duration of the recovery pulse, aka the pulse intended to be a 180° pulse.

This calculation is repeated for all of the wait times in the $T_1$ experiment and for $T_1$ spanning a range of time, for example, between 0.001 s and 10 s, or all the TEs, or all the $T_2$ decays desired to be investigated in the pulse sequence. For very small Tis the motion effect will be minimal. So for $T_1$ between 0.001 s and 0.5 s, for instance, the results of equation 2 or any of its simplifications could be used in place of the model.

The porosity overcall can be correctly accounted for using a more accurate A matrix dataset during inversion processing. Porosity over call (i.e., an erroneous signal) is one of the motional effects. There are two ways to gain too much polarization in relation to the stationary measurement. The first is that the movement causes the sensitive region to move out of the "nulled" zone during the saturation/null pulse. Thus, instead of a partial recovery there is part of the volume that has full recovery. The second mechanism by which the porosity can over call is by magnetization which relaxed within a higher magnetic field moved into the sensitive region faster than the magnetization could reach a new equilibrium. These two effects stack onto each other in most cases since the slowest drilling speed is around 40 ft/hr. The A matrix, A(v), can be constructed for a number of different speeds with different Tis. Although this technique requires long computational time for developing the A(v)s, it only requires being performed once. For low-gradient logging tools, the method proves to be very accurate. In tests, data generated had an average overcall of 2 PU (porosity units) attributed to the motion effects on a short aperture. Applications of one or more techniques taught herein may also provide real-time application as data is logged at a well site.

The inversion maybe be done by many methods including singular value decomposition (SVD), regularization, or another inversion method for minimizing the fitting error. Such inversions may be done on the uphole inversion or the downhole inversion.

X coefficients may be interpreted to determine formation characteristics. The term "bin" is mentioned above (see, e.g., Equation (5)). A bin may be the time (either the $T_1$ or $T_2$ time) to which the X coefficient corresponds. For example, using the basis function in Equation (5), $x_1$ corresponds to the $T_{11}$ or $T_{21}$ time. Thus, conventionally, the data to be telemetered to the uphole processing system is the X coefficient (e.g., $x_1$) and the $T_{11}$ or $T_{21}$ time. To conserve telemetry bandwidth between a downhole system and an uphole processing system in an LWD system or a wireline system (if telemetry bandwidth is limited), a system may limit the number of X coefficient of data that may be telemetered between a NMR tool and an uphole processing system to a prescribed number of bins, which may limit the precision of the calculations that can be done by the uphole processing system.

Figure 10:
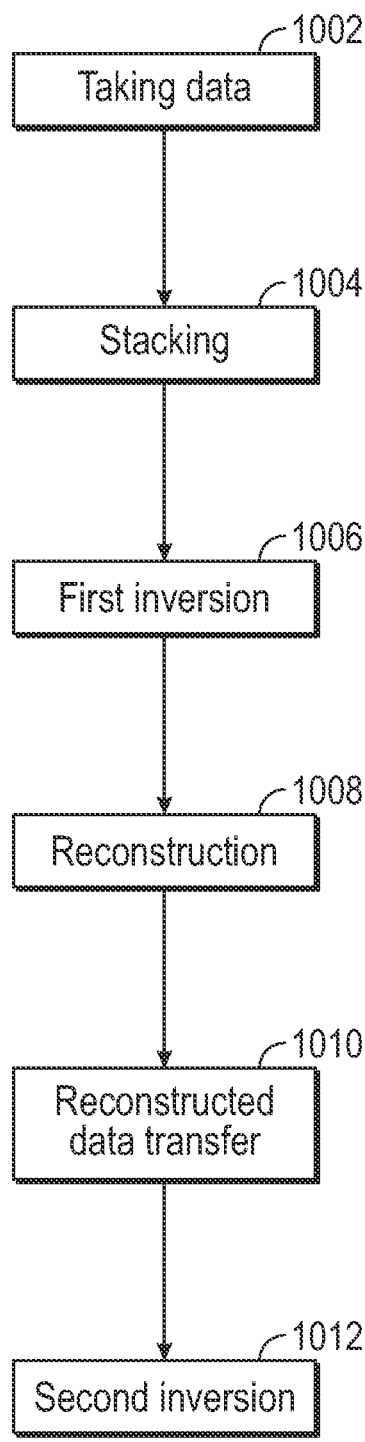
FIG. 10 is a flow chart of a technique for reducing the amount data to be telemetered uphole from an NMR tool, while providing improved quality.

FIG. 10 is a flow chart of an illustrative technique for reducing the amount data to be telemetered uphole from an NMR tool, while providing improved quality. A technique for reducing the amount data to be telemetered uphole from an NMR tool, while providing improved quality, may include the following subprocesses, as shown in FIG. 10: taking data 1002, stacking 1004, a first inversion 1004 performed downhole, reconstruction 1008, reconstructed data transfer 1010, and a second inversion 1012 (performed uphole). In this technique, unlike the conventional technique described above, the X coefficient data is not sent uphole unless an inversion is performed that produces a set of X coefficient that fits within the available bandwidth. Instead, A0 and selected echo train data computed at known experimentation times, is transferred, thereby conserving data transfer bandwidth.

In one sub-technique, when the ROP is not known, downhole information can be transferred to the uphole processor via a subset of reconstructed data to perform the ROP-correct second inversion using the A(v) as described above. In another sub-technique, the ROP used to select the A(v) may be observed at the surface, for example by measuring the time and depth of the NMR tool and calculating the rate a drilling string is penetrating a well bore or by observing another parameter at the surface.

Stacking

In the "stacking" subprocess 1002, which is common to certain schemes described herein, data collected during specific time windows, such as acquisition windows 620-1, ..., 620-8 shown in FIG. 6, is combined in some way to time-equivalent data in a subsequent sequence. For example, selected data from the acquisition windows 620-1, ..., 620-8 shown in FIG. 6 (such as the first point in acquisition window) may be averaged or combined in some other way with the selected data from a subsequent sequence. The stacked data may include a single instance of the echo data where no averaging is done. The stacked data may include the averaging of a phase alternated pair, where the excitation pulse, e.g., excitation pulse 605 in FIG. 6, and recovery pulses, e.g., pulses 610-1, ..., 610-8 in FIG. 6, use different phases in the subsequent sequence. The stacked data may include many phase alternated pair sequences. The stacked data may average the averages of several phase alternated pair sequences.

First Inversion

The first inversion, which is performed downhole in certain embodiments, may be one of the following (specific schemes for carrying out analysis of NMR data is discussed below in connection with FIG. 11), each of these schemes allows for use of one or more of the first inversions described here:
- a $T_2$ inversion using equation (5B) as the basis function,
- a $T_1/T_{2i}$ inversion using equation (3) (which is the same as equation (2) except that $T_{2j}$ is assumed to be proportional to $T_{1i}$ so that $T_{2j} \alpha T_{1i}$ for all i and j for a particular wait time $TW_k$ and $T_{2j}$ is renamed $T_{2i}$), as the basis function, or
- a $T_{1u}/T_{2v}$ inversion using equation (2).

For other embodiments only one inversion will be done, such as the case of post processing or wherein the spectrum is transmitter uphole in realtime instead of reconstructed echo, or compressed reconstructed echoes. When a single inversion is done the above schemes are also used.

Data Reconstruction

Generally, data reconstruction starts from the basis function used during the first inversions. The reconstructed data, $Y_{reconstructed}$, just as the original data was, is also a vector containing data at times for each different wait time and desired data point times within that wait time. Each reconstructed data point corresponds to one reconstruction time point in the vector times.

$$Y_{reconstructed} = \begin{bmatrix} y^1(1) \\ y^1(2) \\ \ldots \\ y^1(n_1) \\ y^2(1) \\ y^2(2) \\ \ldots \\ y^2(n_2) \\ \ldots \\ y^m(1) \\ y^m(2) \\ \ldots \\ y^m(n_m) \end{bmatrix},$$

$$\text{times} = t_j^k = \begin{bmatrix} t^1(1) \\ t^1(2) \\ \ldots \\ t^1(n_1) \\ t^2(1) \\ t^2(2) \\ \ldots \\ t^2(n_2) \\ \ldots \\ t^m(1) \\ t^m(2) \\ \ldots \\ t^m(t_m) \end{bmatrix},$$

The elements $y^k_{j_{reconstructed}}$ of $Y_{reconstructed}$ are calculated using the basis function that was used during the first inversion, such as equations (15A) and (15B).

$$y^k_{j_{reconstructed}}(t_j^k) = \sum_{i=1}^{p} x_i A_{ij}^k(t_{ij}^k) \tag{15A}$$

$$y^k_{j_{reconstructed}}(t_j^k) = \sum_{u=1}^{q} \sum_{v=1}^{p} x_{uv} A_{uvj}^k(t_{uvj}^k) \tag{15B}$$

Figure 13:
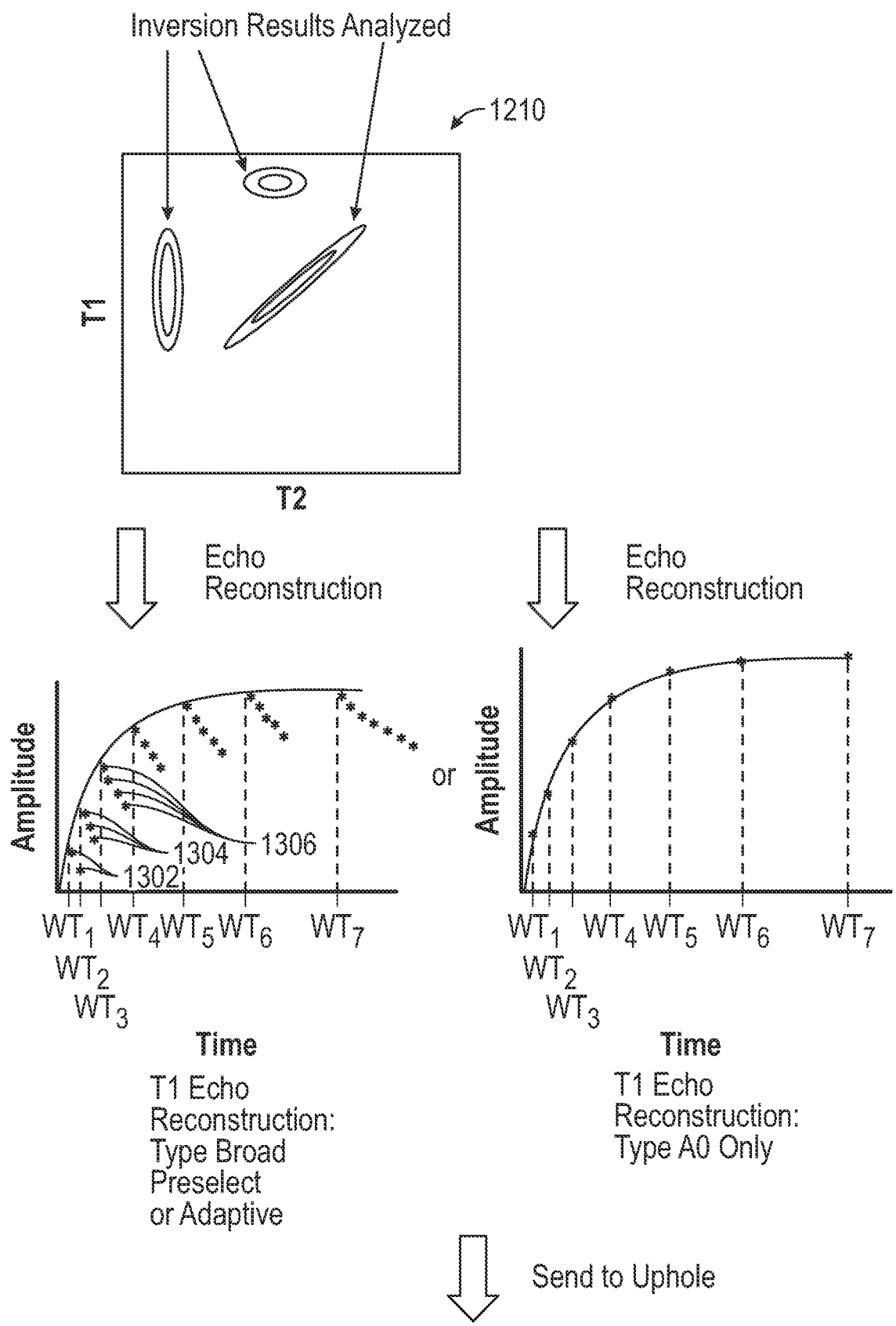
FIG. 13 is a chart illustrating reconstruction of echoes and A0 from inverted T1 data.

The number of points reconstructed for each wait time does not need to be the same, as illustrated in FIG. 13 (e.g., the reconstructed data for $WT_1$ may include 2 points 1302, the reconstructed data for $WT_2$ may include 3 points 1304, the reconstructed data for $WT_3$ may include 4 points 1306, etc.) in the above equation.

One of the most desired points to reconstruct is A0. The original basis function, if not derived from an equation, such as would be the case when using $A_{ij}^k(v)$, might not include an $A_{ij}^k(t=0)$. In this case a correction factor is applied to determine A0. The correction factor may be calculated using the $T_2$ decay:

$$y = e^{-\frac{t}{T_{2i}}} \tag{16}$$

For example, if only the A0 were to be calculated, and only one TE was used, the reconstruction equation would be:

$$y^k_{j_{reconstructed}}(t_j^k = 0) = \frac{\sum_{i=1}^{p} x_i A_{ij}^k(t = TE)}{e^{-\frac{TE}{T_{2i}}}} \tag{17}$$

Assuming $A_{ij}^k$ was created using equation (5A), reconstruction is open to any desired times for each WT, as shown in the following equation (ignoring diffusion effect):

$$y^k_{j_{reconstructed}}(t_j^k) = \sum_{i=1}^{p} x_i \cdot \left(1 - e^{-\frac{TW_k}{T_{1i}}}\right) \cdot e^{-\frac{t_{ij}^k}{T_{2i}}} \tag{18}$$

In one technique, reconstructed $T_1$ data is A0 data for various WTs. A vector of A0 data (i.e., one A0 for each WT, or other times along the WT axis) can be reconstructed using the following equation for elements reconstruction:

$$y^k_{j_{reconstructed}}(t=0) = \sum_{i=1}^{p} x_i \cdot \left(1 - e^{-\frac{TW_k}{T_{1i}}}\right) \cdot e^{-\frac{0}{T_{2i}}} = \sum_{i=1}^{p} x_i \cdot \left(1 - e^{-\frac{TW_k}{T_{1i}}}\right) \quad (19)$$

In another technique, for example, the reconstructed data could be for the first echo, as in the following equation:

$$y^k_{j_{reconstructed}}(t^k_j = TE) = \sum_{i=1}^{p} x_i \cdot \left(1 - e^{-\frac{TW_k}{T_{1i}}}\right) \cdot e^{-\frac{TE}{T_{2i}}} \quad (20)$$

The reconstructed data may also include A0 along with non-zero times, as in the following equation, which, when evaluated for each k, produces a vector of reconstructed data for each WT:

$$y^k_{j_{reconstructed}}(t^k_j = 0, \text{times} \neq 0) = \sum_{i=1}^{p} x_i \cdot \left(1 - e^{-\frac{TW_k}{T_{1i}}}\right) \cdot e^{-\frac{[t=0, t_k]}{T_{2i}}} \quad (21)$$

where $t_j^k$ are selected times.

There are alternative methods to that of FIG. 10. In a first example, the technique may reduce the amount data to be telemetered uphole from an NMR tool, while providing improved quality for real time data processing. Here, the method would begin by taking data, followed by stacking, application of the filter, then the first inversion, reconstruction, the reconstructed data transfer, followed by the second inversion, then recording the data to the log. In a second example, the method would be for typical NMR processing in post processing. Here, the method begins with taking data, stacking, filtering, performing the inversion, then recording the data to the log.

Schemes for Implementing the Technique

Figure 11:
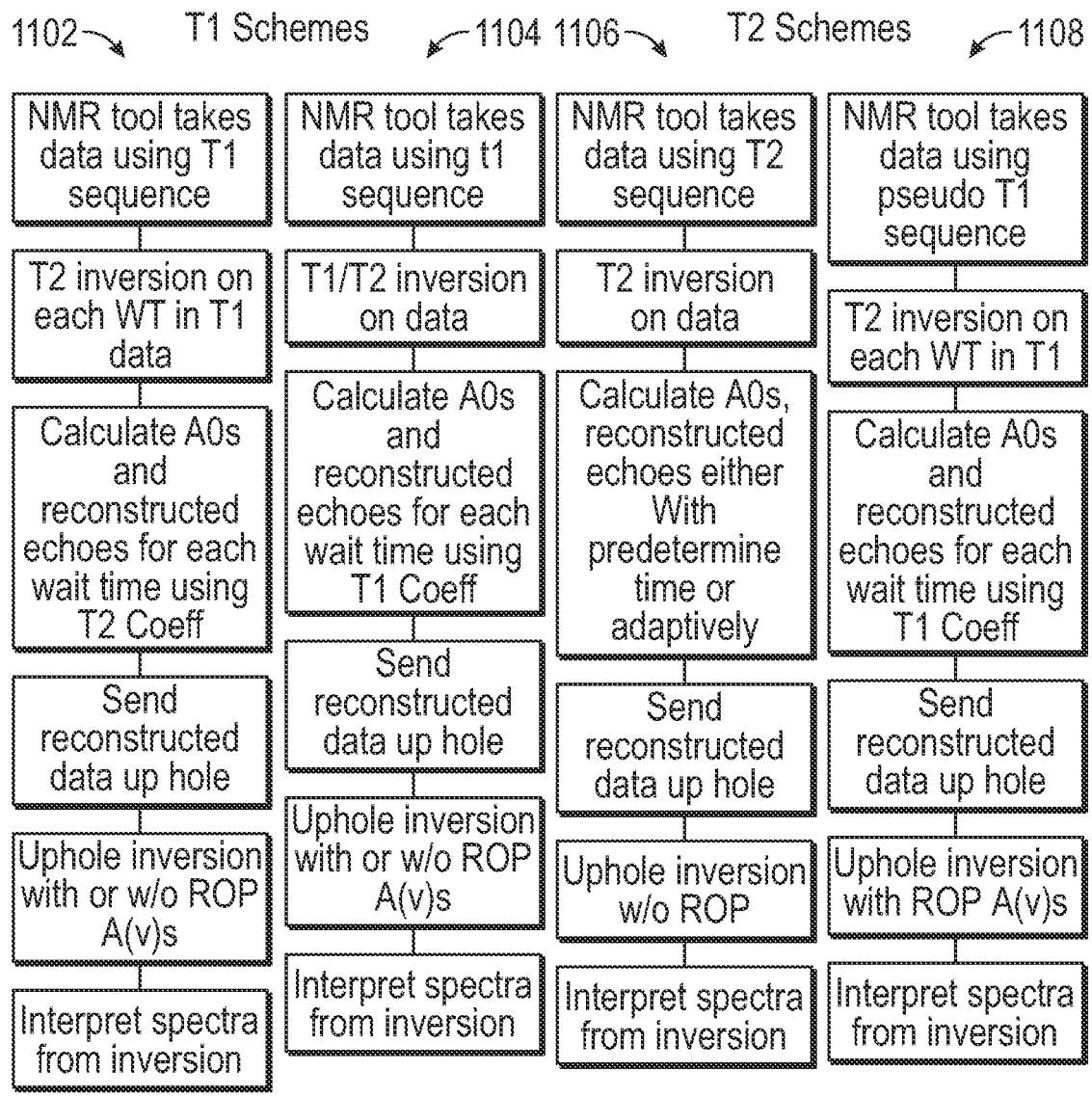
FIG. 11 illustrates four schemes for implementing the real time technique generally described above in FIG. 10.

FIG. 11 illustrates four illustrative schemes for implementing the multiple inversion technique generally described above. The four schemes are divided into two sets of schemes, as illustrated in FIG. 11: $T_1$ schemes and $T_2$ schemes.

Figure 12:
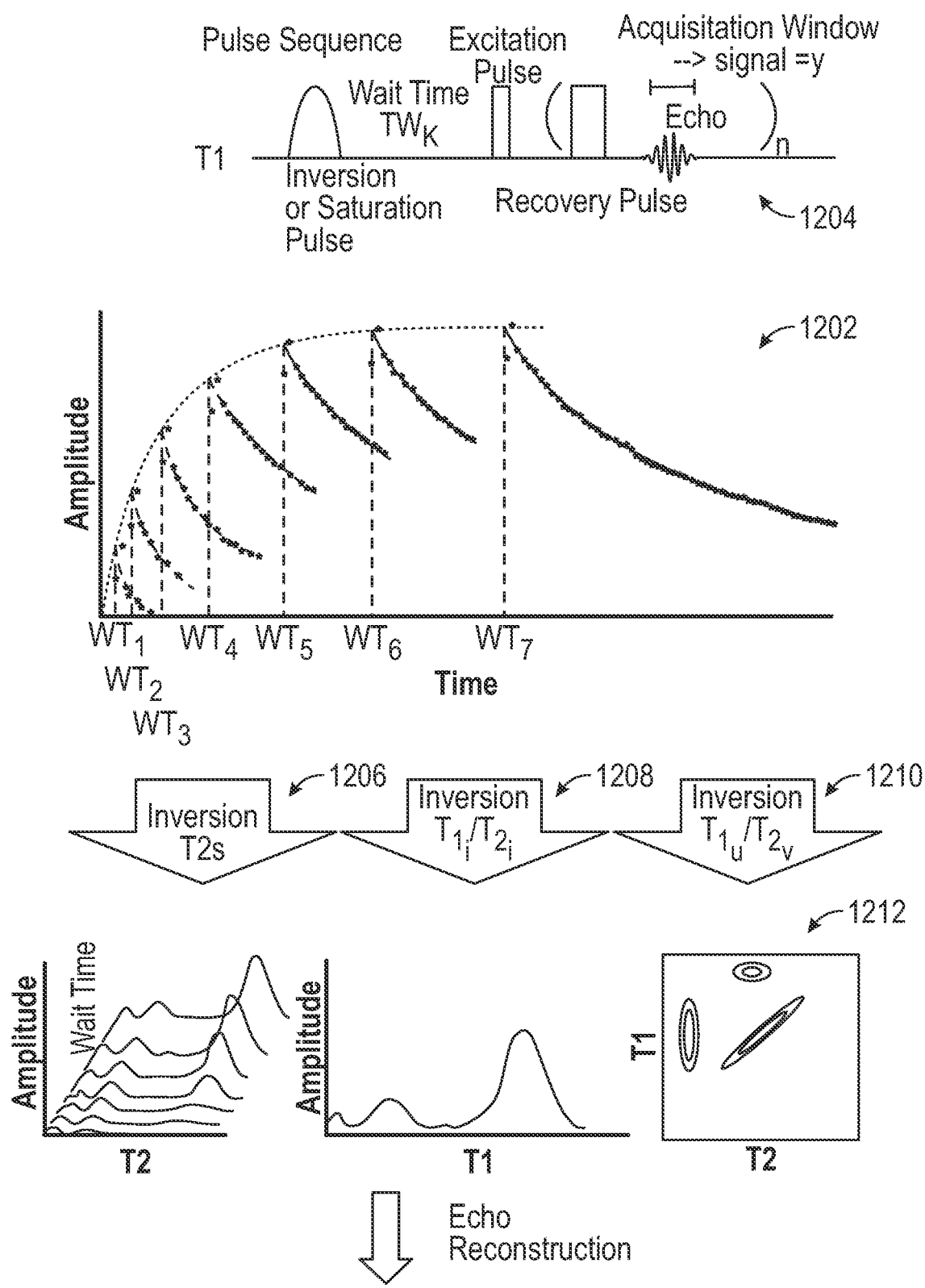
FIG. 12 is a chart illustrating $T_1$ inversions followed by a echo reconstructed, which is relevant for the real time reduced data size telemetry technique.
Figure 14:
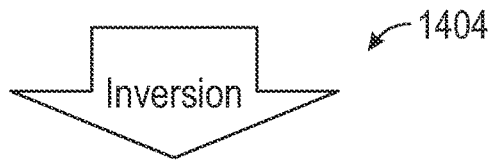
FIG. 14 is a chart illustrating a $T_1$ uphole inversion done after reconstructed echoes are transmitted for real time processing.
Figure 14:
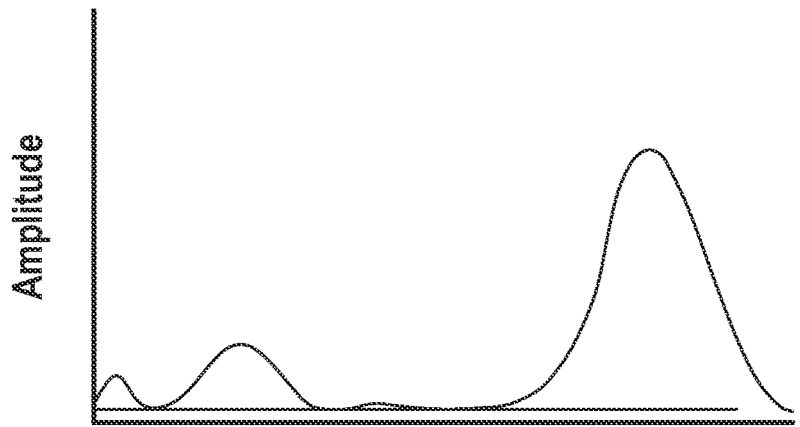
Figure 14:
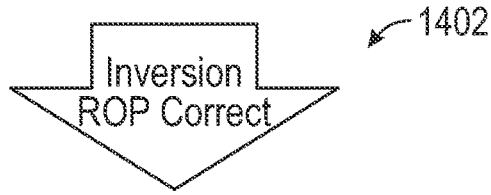
Figure 14:
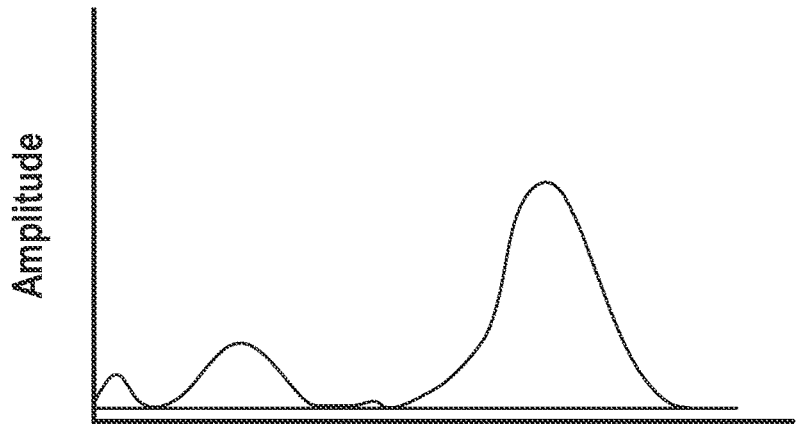
Figure 15:
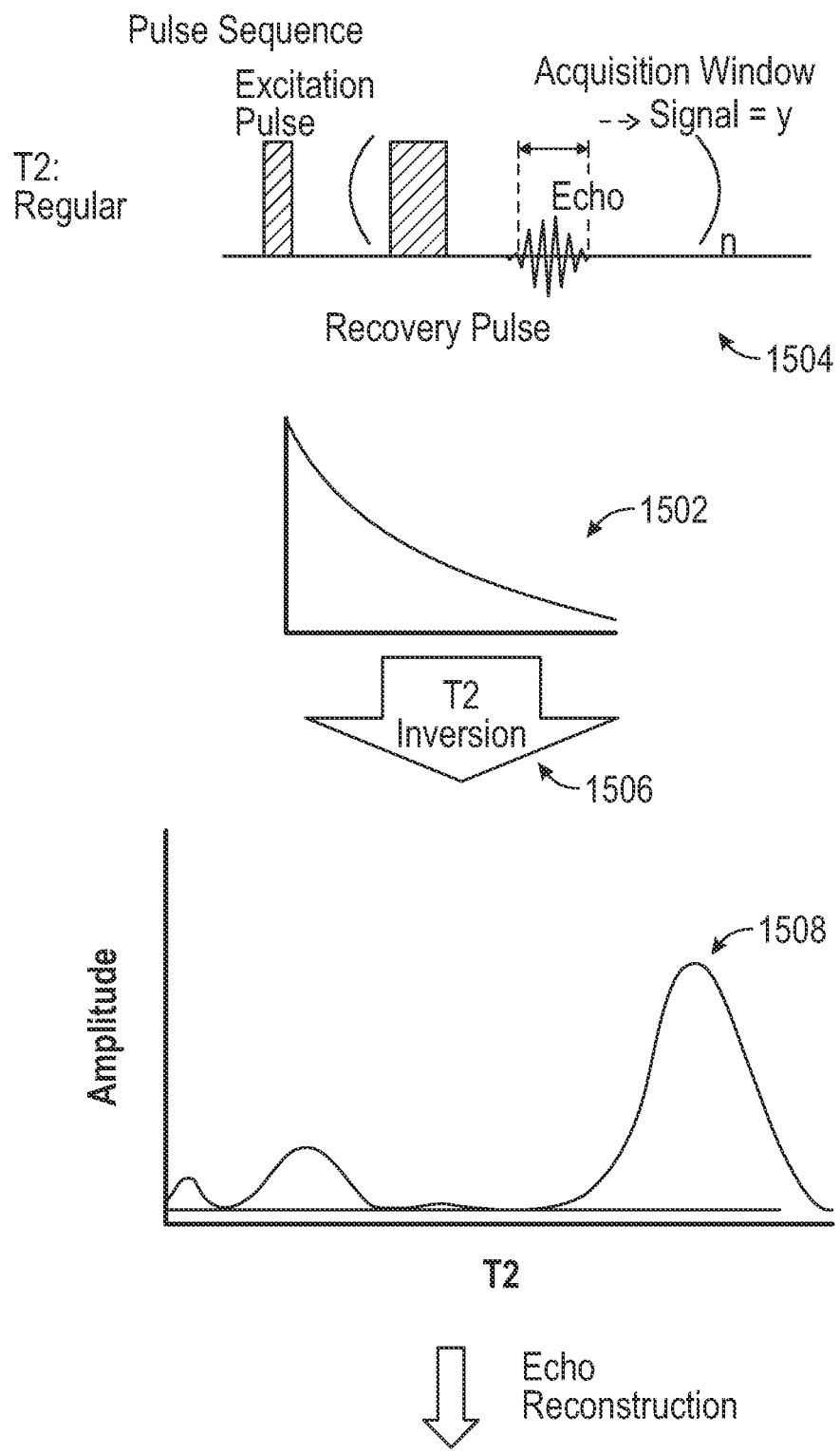
FIG. 15 is a chart illustrating inversion of $T_2$ data followed by a echo reconstructed, which is relevant for the real time reduced data size telemetry technique.
Figure 16:
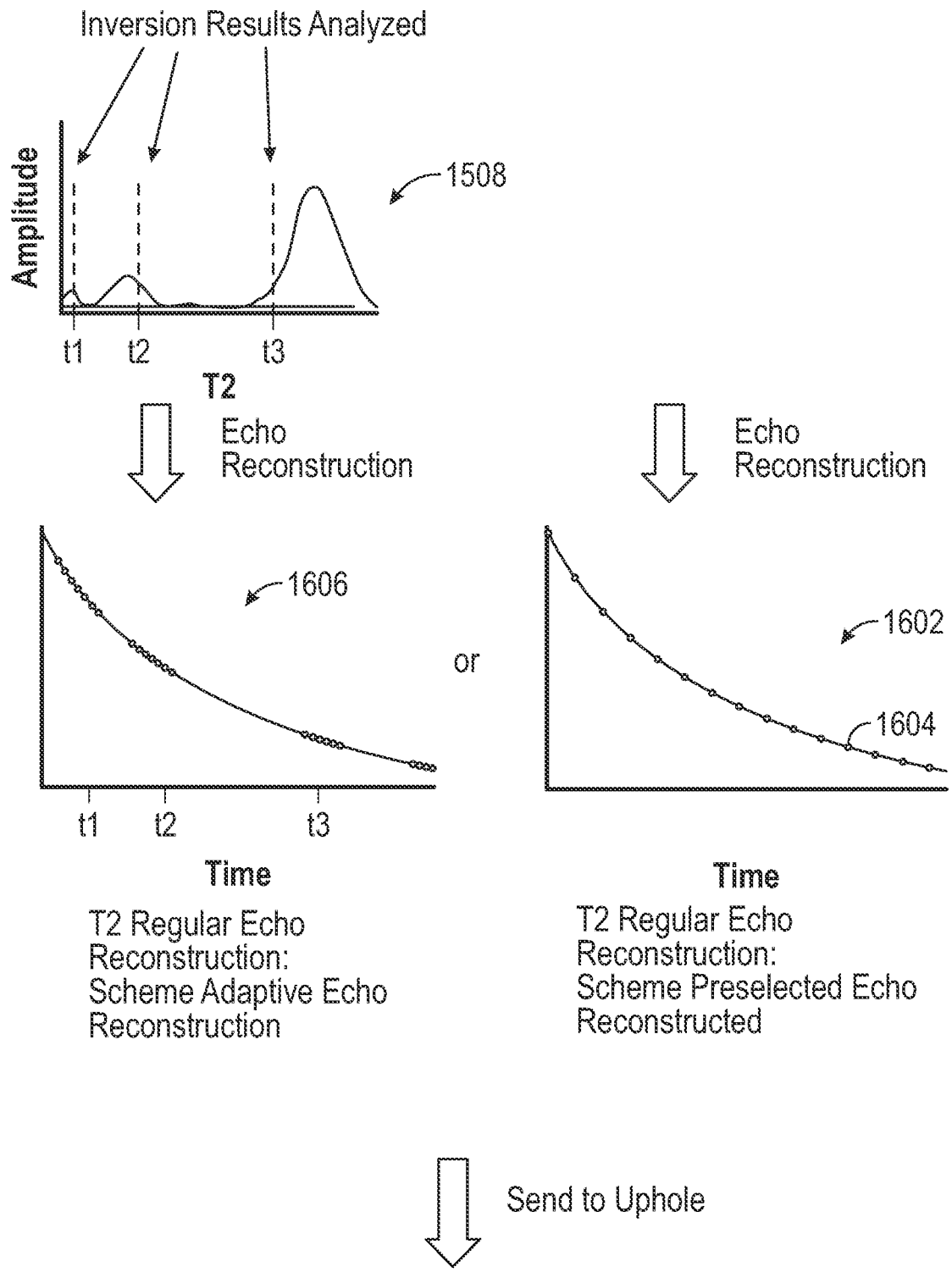
FIG. 16 is a chart illustrating two techniques for reconstructing $T_2$ curves.
Figure 17:
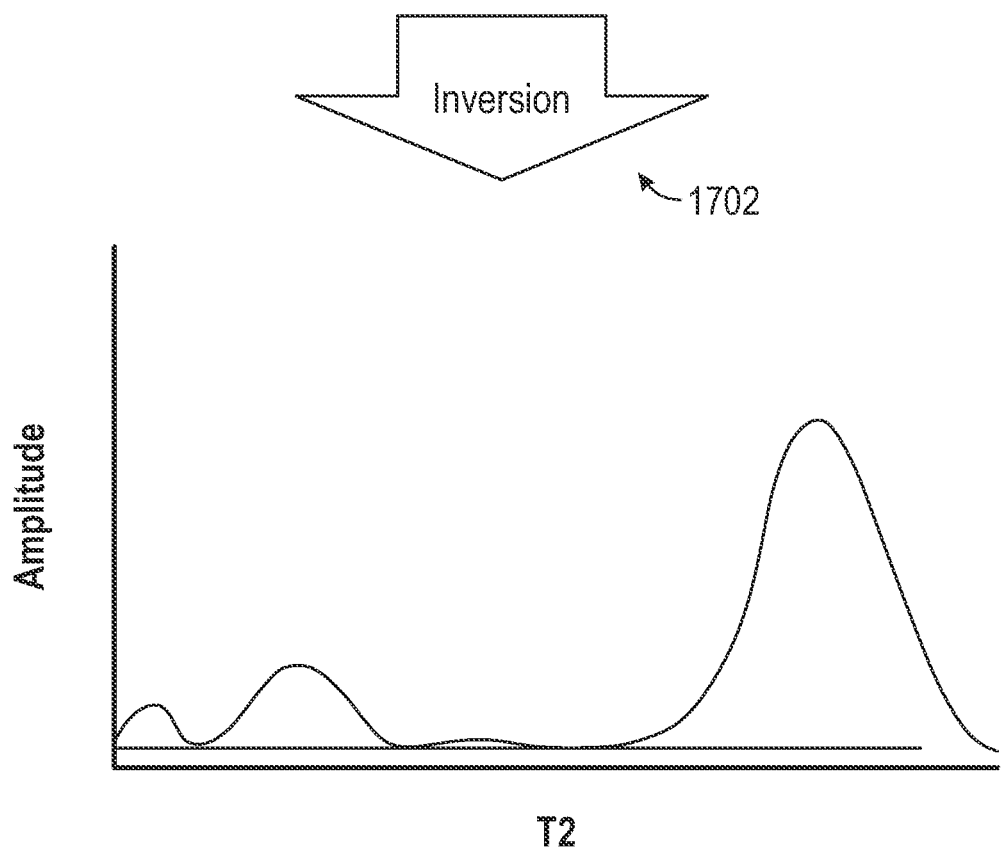
FIG. 17 is a chart illustrating a $T_2$ regular uphole inversion done after reconstructed echoes are transmitted for real time processing.
Figure 18:
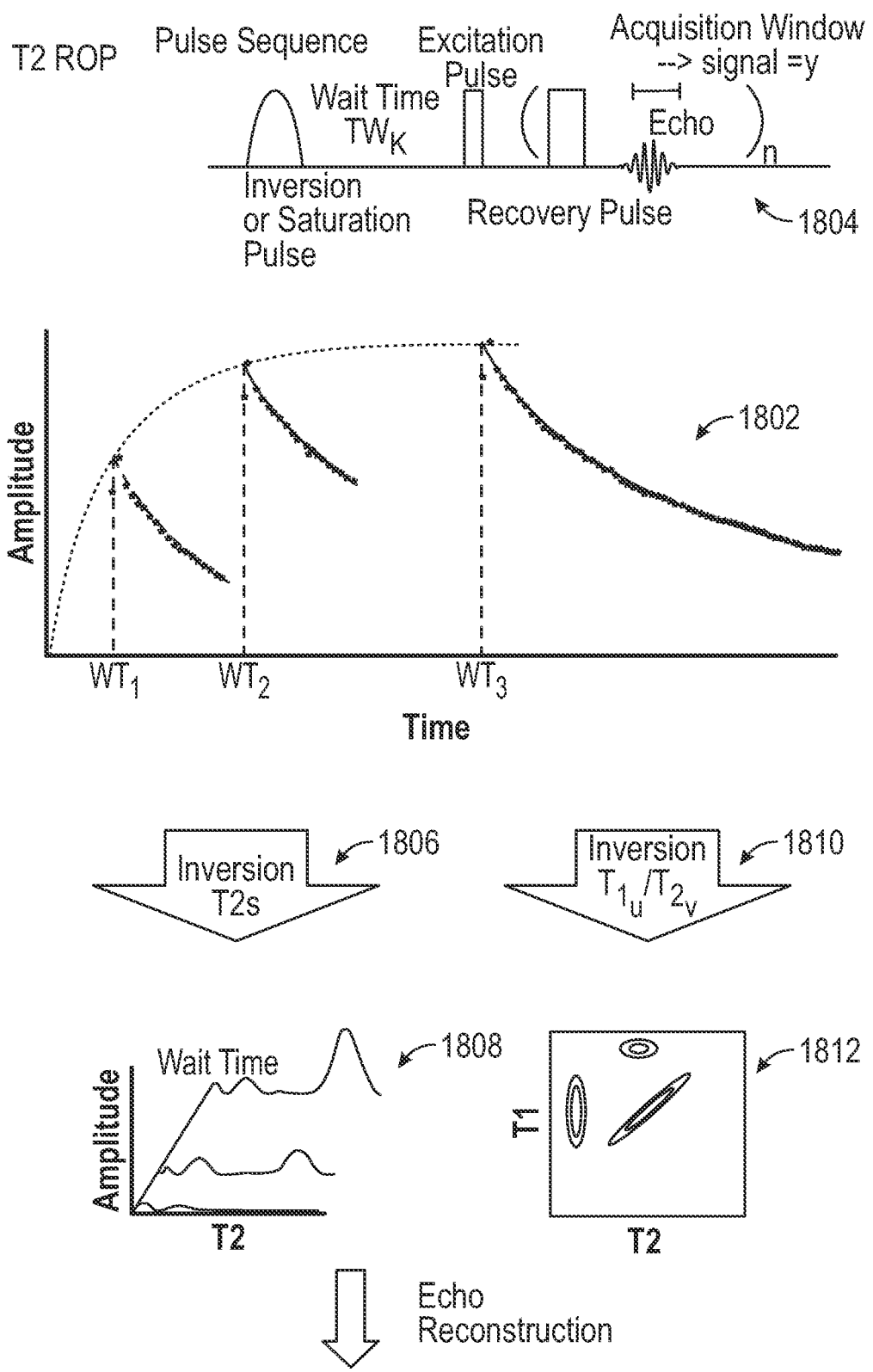
FIG. 18 is a chart illustrating inversions of $T_2$ data in a ROP-corrected scheme.
Figure 19:
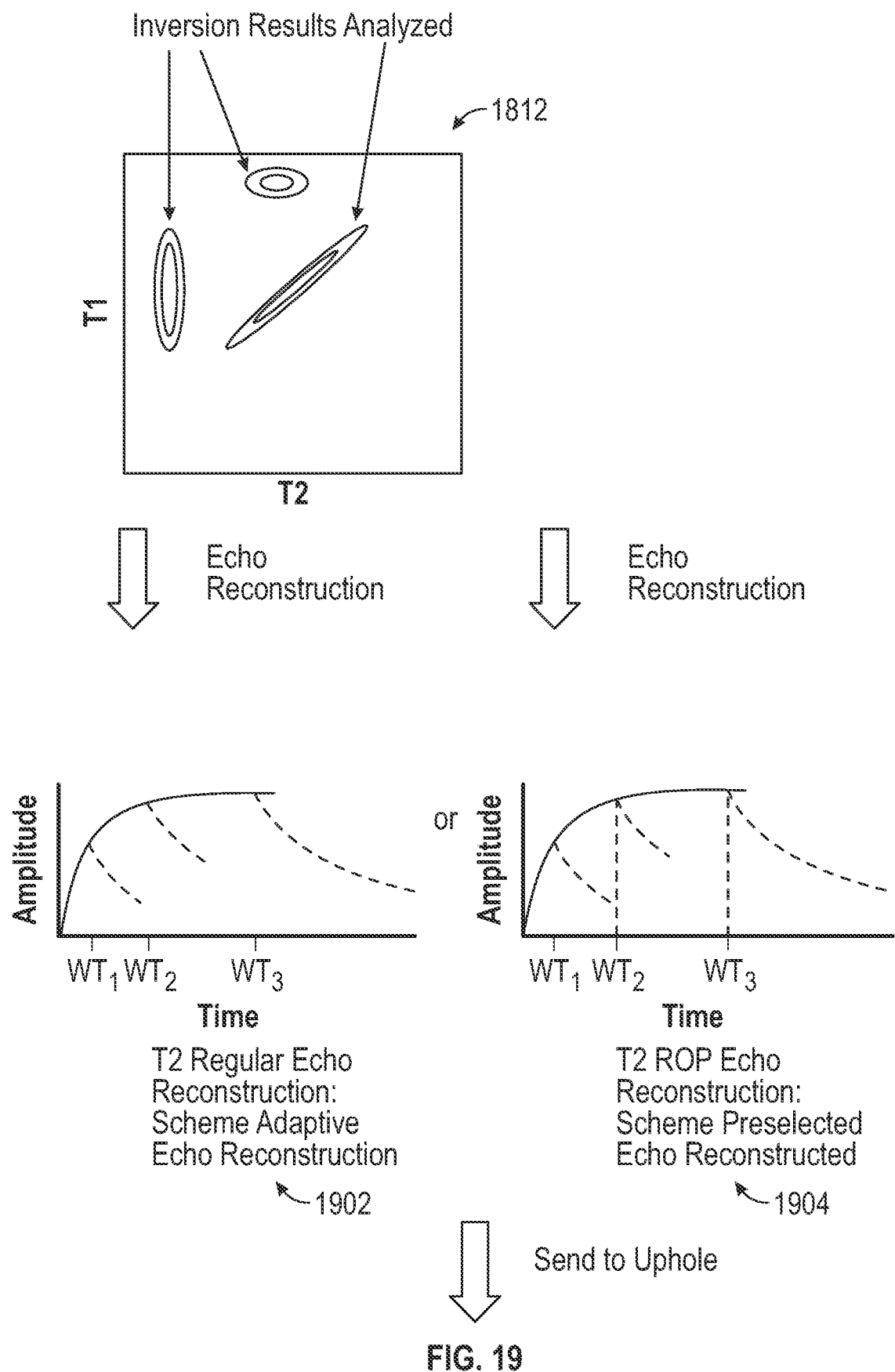
FIG. 19 is a chart illustrating reconstruction of $T_2$ echoes in a ROP-corrected scheme.
Figure 20:
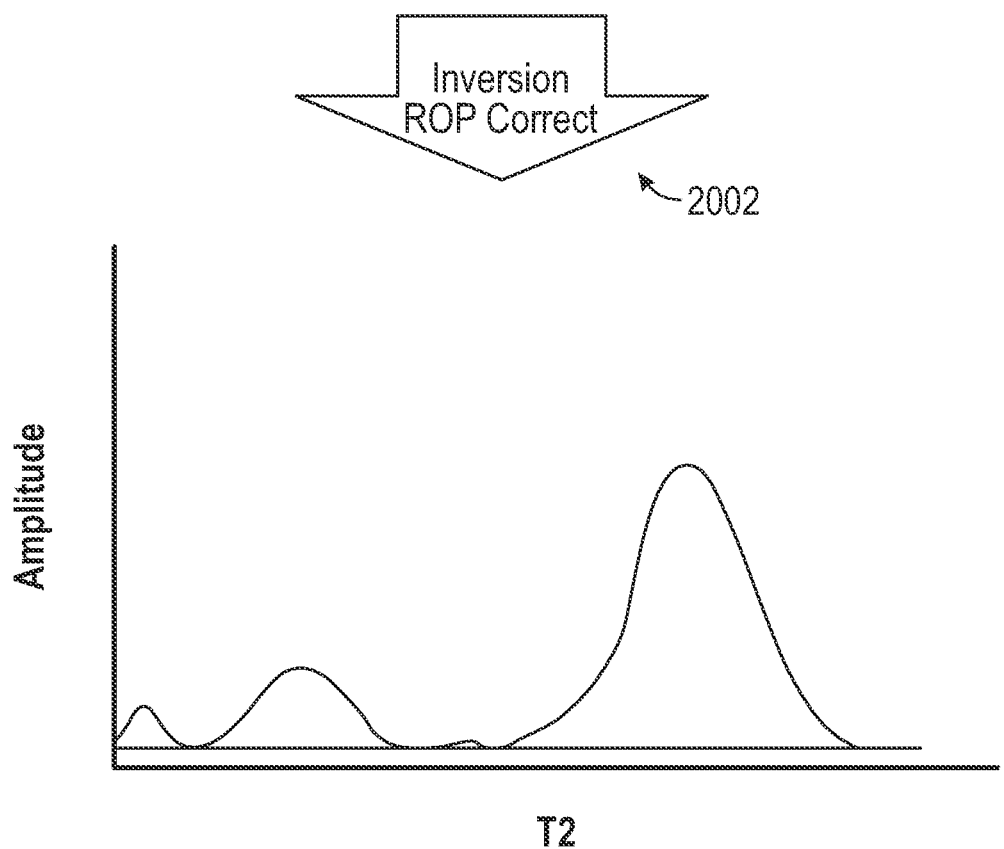
FIG. 20 is a chart illustrating a $T_2$ uphole inversion in a ROP-corrected scheme.

FIGS. 12, 13, and 14 illustrate the $T_1$ schemes. FIG. 12 is a chart illustrating $T_1$ inversions. FIG. 13 is a chart illustrating reconstruction of echoes and A0 from inverted $T_1$ data. FIG. 14 is a chart illustrating a $T_1$ uphole inversion. FIGS. 15-20 illustrate the $T_2$ schemes. FIG. 15 is a chart illustrating inversion of $T_2$ data. FIG. 16 is a chart illustrating two techniques for reconstructing of $T_2$ curves. FIG. 17 is a chart illustrating a $T_2$ regular uphole inversion. FIG. 18 is a chart illustrating inversions of $T_2$ data in an ROP-corrected scheme. FIG. 19 is a chart illustrating reconstruction of $T_2$ echoes in an ROP-corrected scheme. FIG. 20 is a chart illustrating a $T_2$ uphole inversion in an ROP-corrected scheme.

First $T_1$ Scheme (1102)

In a first $T_1$ scheme 1102 (see FIG. 12): The NMR tool takes data 1202 using a $T_1$ sequence 1204. A $T_2$ inversion 1206 is performed on each WT in the $T_1$ data. The $T_2$ inversion determines the $x_i$ coefficients for the data for each wait time by using a basis function such as in equations (5B), (5C), or (5D) to create $A_{ij}^k$.

The A0s are calculated and echoes are reconstructed for each reconstruction wait time using $T_2$ coefficients. For example, equation (5A) may be used to reconstruct the $T_2$ data. The A0 values are the values of the $T_2$ data at time=0 for each wait time.

The reconstructed data is sent uphole. An uphole inversion (see FIG. 14) is done with (1402) or without (1404) ROP A(v)s. When the uphole inversion compensates for a rate-of-penetration (ROP) motion measured on an uphole portion of a drilling system the inversion can include an inversion matrix $A_{ij}(v)$ which has the motion effect calculated as shown above. An ROP observed at the surface, for example by measuring the rate a drilling string is proceeding into a well bore or by observing another parameter at the surface, may be to select the A(v) used in the second inversion. The spectra are then interpreted from the inversion.

Second $T_1$ Scheme (1104)

In a second $T_1$ scheme 1104 (see FIG. 12): The NMR tool takes data 1202 using a $T_1$ sequence 1204. A $T_{1i}/T_{2i}$ inversion 1208 is performed on the data 1202 to determine $x_i$ coefficients of the data by using a basis function such as equation (3). Alternatively, a $T_{1u}/T_{2v}$ inversion 1210 is performed on the data 1202 to determine $x_{ij}$ coefficients of the data by using a basis function such as equation (2). The result of the $T_{1u}/T_{2v}$ inversion 1210 is a "map" 1212 in which, for example, the x axis is the $T_{2v}$ time domain and the y axis is $T_{1u}$ time domain, as shown in FIG. 12. The intensity of the map is the amplitude of the signal at those $T_{uv}$ bin spots. The $A_{uv}^k$ may be calculated on the fly downhole prior to the inversion or they could be preloaded. Further, the basis function for inversion is not limited to that of equation (5A). For instance, the basis function could be that of $A_{uv}^k(v)$ where the v is preselected before the data is taken, is loaded in the memory onto the tool, and is used to reconstruct the echoes.

The A0s are calculated and echoes are reconstructed for each wait time using $T_1$ coefficients, as illustrated in FIG. 13. The reconstructed data is sent uphole. An uphole inversion (see FIG. 14) is done with 1402 or without 1404 ROP A(v)s. When the uphole inversion compensates for a rate-of-penetration (ROP) motion measured on an uphole portion of a drilling system the inversion can include an inversion matrix $A_{ij}(v)$ which has the motion effect calculated as shown above. An ROP observed at the surface, for example by measuring the rate a drilling string is proceeding into a well bore or by observing another parameter at the surface, may be to select the $A_{ij}^k(v)$ used in the second inversion.

The spectra is interpreted from the inversion.

First $T_2$ Scheme (1106)

In a first $T_2$ scheme 1106 (see FIG. 15): The NMR tool takes data 1502 using a $T_2$ sequence 1504. A $T_2$ inversion 1506 is performed on the data 1504 to produce results 1508 of the first inversion, i.e., the $x_i$ coefficients.

The A0s are calculated and the echoes are reconstructed either with predetermined times or adaptively. FIG. 16 is a chart illustrating two techniques for reconstructing $T_2$ curves. A $T_2$ curve is reconstructed from the results 1508 of the first inversion 1504 of the stacked $T_2$ data 1506 by selecting the time position of the echoes being reconstructed. While the number of techniques for selecting the time positions is unlimited, there are two general schemes that can be followed. Both schemes can be expressed using equation (18).

In a first reconstruction scheme, represented by curve 1602, the times are preselected and the points 1604 (only one is labeled) are calculated for those preselected times. This scheme is likely to contain the A0 for the echo train. The spacing between echoes could be linear at multiples of TE (the inter-echo time, see FIG. 6). For example, every $4^{th}$ echo of the original train could be recalculated. The scheme could also be non-linear. For example, shorter $T_2$s have a fast drop off so more points may be selected early on and then fewer at later times to account for that.

In a second reconstruction scheme, represented by curve 1606, time positions of the reconstructed echoes are selected adaptively. Typically, the time positions include A0 (i.e., t=0) and a time at the end of the time when the data for the echo was received or from a time far enough out that the reconstructed echoes are unequivocally 0. One adaptive scheme uses concentrations of points, separated by, for example TE, around times where peaks appear in the spectrum created by the coefficients (i.e., times t1, t2, t3 . . . ) in the results of the first inversion 1508, as shown in curve 1606.

The reconstructed data is sent uphole. In the preselected times scheme, the timing information is already known by the uphole processor and is ready to be used for the uphole inversion. As such, only the reconstructed data need be transferred. In contrast, in the adaptive reconstruction scheme, information about the times of the echoes needs to be sent uphole along with the reconstructed data.

FIG. 17 is a chart illustrating a $T_2$ regular uphole inversion. An uphole inversion 1702, shown in FIG. 17, is done on the reconstructed data without ROP correction. When the uphole inversion compensates for a rate-of-penetration (ROP) motion measured on an uphole portion of a drilling system the inversion can include an inversion matrix $A_{ij}(v)$ which has the motion effect calculated as shown above.

The spectra are interpreted from the inversion.

Second $T_2$ Scheme (1108)

FIG. 18 is a chart illustrating inversions of $T_2$ data in an ROP-corrected scheme. FIG. 19 is a chart illustrating reconstruction of $T_2$ echoes in an ROP-corrected scheme. In a second $T_2$ scheme 1108: The NMR tool takes $T_2$ data 1802 using a sequence 1804 with a number of wait times. The number of wait times could be as few as 1 and has no upper limit, but over 25 would be excessive in downhole conditions. FIG. 18 demonstrates a sequence with 3 wait times. The sequence in FIG. 18 has 1 longest wait time with a large number of echoes and 2 shorter wait times with fewer echoes than the one with the longest wait time. The wait times are not limited to be long or short in this sequence, but there is a sequence where all wait times for the $T_2$ ROP corrective scheme are greater than 0.1 seconds.

A $T_2$ inversion 1806, using one of equations (5B), (5C), or (5D), is performed on each WT in the data to produce a $T_2$ inversion result 1808 for each wait time. Alternatively a $T_1/T_2$ inversion 1810 using, for example, one of equations (5E), is performed on the data to produce a $T_1/T_2$ inversion map 1812.

The A0s are calculated and the echoes are reconstructed for each wait time using $T_2$ coefficients 1808 or the $T_1/T_2$ inversion map 1812. The inversion data is processed to identify the times where the $T_2$ coefficients 1808 or $T_1/T_2$ inversion map 1812 shows the most intensity. The $T_1/T_2$ inversion map 1812 is then reconstructed using, for example, equation (15B), to produce the $T_2$ echo reconstruction 1902, which has greater density at the times where the $T_1/T_2$ inversion map 1810 shows the most intensity. Alternatively, the echo reconstruction 1904 could be produced using the $T_2$ coefficients 1808 or $T_1/T_2$ inversion map 1812 with for example, equation (15B), and preselected times.

The reconstructed data is sent uphole.

FIG. 20 is a chart illustrating a $T_2$ uphole inversion in an ROP-corrected scheme. An ROP-correct uphole inversion 2002 is performed on the reconstructed data, which is possible because the reconstructed data includes both $T_1$ and $T_2$ data. When the uphole inversion compensates for a rate-of-penetration (ROP) motion measured on an uphole portion of a drilling system the inversion can include an inversion matrix $A_{ij}(v)$ which has the motion effect calculated as shown above. An ROP observed at the surface, for example by measuring the rate a drilling string is proceeding into a well bore or by observing another parameter at the surface, may be used to select the $A_{ij}^k(v)$ used in the second inversion.

An ROP observed at the surface, for example by inverting data by an uphole processor to produce the lowest-error $A(v)$, may select the $A_{ij}^k(v)$ used in the second inversion.

The resulting data may then be inverted using the lowest-error $A(v)$ to produce the correct spectra. The spectra are results from the inversion, which are then interpreted.

In a different embodiment the inversion downhole is done in such a way that there is enough bandwidth to send the inversion results $x_i$ uphole. This may limit the number of spectra results to for example under 20 points. The $x_i$ results are then used to reconstruct the data uphole using equation 15(A) or 15(B). The reconstructed data will undergo a second inversion with an ROP correct A. An ROP observed at the surface, for example by measuring the rate a drilling string is proceeding into a well bore or by observing another parameter at the surface, may be to select the $A_{ij}^k(v)$ used in the second inversion. When only a single inversion is used, the inversion method can still calculate a ROP and the appropriate $A_{ij}^k(v)$ used as the inversion basis function.

In view of the foregoing, various systems and methods for removing undesired additional signal from the NMR signals will now be described. The filtering methods described below may be used in conjunction with any of the methods described herein. As previously discussed, the filtering methods are applied to logs of NMR data infected with high over-call due to high motion. The data logged by the NMR tool consists of echoes. The entire processed data is known as the log. In certain embodiments, an instance of data consists of averaging several echo trains together, applying filters to the echo trains, and possibly inverting the data to a spectrum or reconstructing the echoes.

The NMR Data has many points (or numbers). Each point within the data might be referred to as an instance of the data (data instance). Data has many forms depending on how much processing has occurred to the data. Data is acquired by an experiment and is a single set of data or a group of data from a single experiment. The experiment in NMR is referred to as the pulse sequence which results in a set of data which is made of echoes.

The data instance is a dataset made up of many data points. For example, a typical echo train will have echoes anywhere from 3 to over 2,000. A typical spectrum could have very few entries, for example 12, or many entries, for example 52. The number of entries in a spectrum is only limited by the number of relations rates tested in the inversion. A typical echo reconstruction for a T1 sequence will have data entries equal to the number of wait times preformed in the sequence, but is not limited to this value as any number can be calculated from the echo train instance's spectrum and basis functions of the inversion. Due to the nature of the NMR measurement, each data entry (or data point) will have an associated time with it and the data entries are organized according to increase in time. Thus, the data points will have corresponding index counts representing the position of that data point from the beginning of the dataset to the end.

The number of echo trains which are averaged will depend on the targeted SNR for the result. This could mean as few as 1 echo trains are averaged, however, to eliminate ringing usually the minimal number selected will be 2 echo trains to create a phase alternated pair. In certain illustrative embodiments, the echo trains are averaged with a moving window. That is to say, for example, if there are 20 sets of echoes, the first instance of the data is the first 5 echo trains averaged together. Any kind of filter method can be used to create an instance of data including, for example, a boxcar filter. Another instance of data may consist of averaging the second echo train and the next 4 consecutive echo trains up to the 6th one. This would be a second instance of the data. The rest of the echo trains are averaged out similarly to create each instance of data. In this manner only 15 instances of data can be created, but the moving window averaging filters do not have to be limited to this method, it is only an example.

In yet another method, 20 echo trains may result in 20 instances of data. A neighboring instance of data is the numerically consecutive instance of data that proceeds or follows the current instance of data. For example, if there are 15 instances of data, the 1st neighbors for the 10th instance would be both the 9th instance and the 11th instance of data. The 2nd neighbors for the 10th instance would be both the 8th instance and the 12th instance of data. The number of neighboring data points to use can be selected. If only one neighbor of data is selected either the data instance that follows the current data or proceeds it should be selected for the whole of processing. If more than one neighbor is selected the neighbors proceeding only or following only could be selected, the end result with be a slight shift in depth. The ideal way to select neighbors is symmetrically, so that for each neighbor selected that proceeds the data one is selected that follows the data instance.

As will be described in more detail below, once the neighbors are identified, the instances of data are compared to each other. Within the data instances (which could be a spectrum reconstructed echo set, or the averaged echoes) each entry of the data at a particular associated time are compared. Here, each data point in the data instance has a corresponding index count representing a position of that data point from a beginning of the dataset to an end of the dataset. The entry with the smallest (minimal) value is recorded into a new data entry, which will replace the original in the log. These methods may also be referred to herein as an overlapping filter or low filter.

The overlapping or low filters described herein may be applied to a variety of data signals. For example, the filters may be applied at the spectrum level, the echo reconstruction level in real-time, or at the echo train level. This embodiment applies the technique to the spectrum instance. The neighboring spectrum points are compared to find the smallest value among each grouping. With regard to spectrum level correction, data number of echo trains are averaged, and a median or other filter that is not a low filter can be applied. The processed data is then inverted to generate a spectrum dataset. Iteratively the spectrum in the log are grouped by a window and instances of the same index in the spectrum undergo the overlapping/low filter.

In another example, the filter may be applied at the reconstructed echo level for real time filtering. Though the method of multiple inversion is intended for real time data processing, it can also be done in post processing. For real time, as previously described herein, an inversion is applied by the downhole processor to reconstruct echoes, compress the reconstructed echo data, transmit it uphole, and then apply a second inversion (which could be motion inclusive or stationary) to gain the spectrum which is then used for interpretation. This method allows for a pre-inversion correction to the A0s to removes the high lateral motion effects. In this situation, the data instances are still inverted and echo recreated down hole, then compressed and then sent uphole, and uncompressed uphole. The low filter described herein may be applied to the reconstructed echoes datasets. In such a method, a number of neighboring reconstructed echo datasets are selected using a window. The entries of the same index in the window are iteratively compared to each other to determine the minimal value. Then the new instance of reconstructed echo are stored into a new reconstructed dataset log (as the minimal value) and is used for the inversion (motion inclusive or stationary) to give a spectrum which has true porosity.

In yet other illustrative methods, the low filter may be applied at the echo train level. In this example, the method is applied at the echo level prior or after averaging. In this case, the data could be processed with averaging of 1, 2, or the regular number of train averages. Iteratively the echo trains in the log are grouped by a window and instances of the same index in the echo train undergo the overlapping/low filter. Each entry at the same time index in the echo train group is compared to find the smallest value. The newly created echo is recorded into a new echo train set to make a new NMR train log. The echo trains then continue processing as they would be otherwise incur, which may include any number of other filters, more averaging, inversions, and echo reconstruction.

Figure 21:
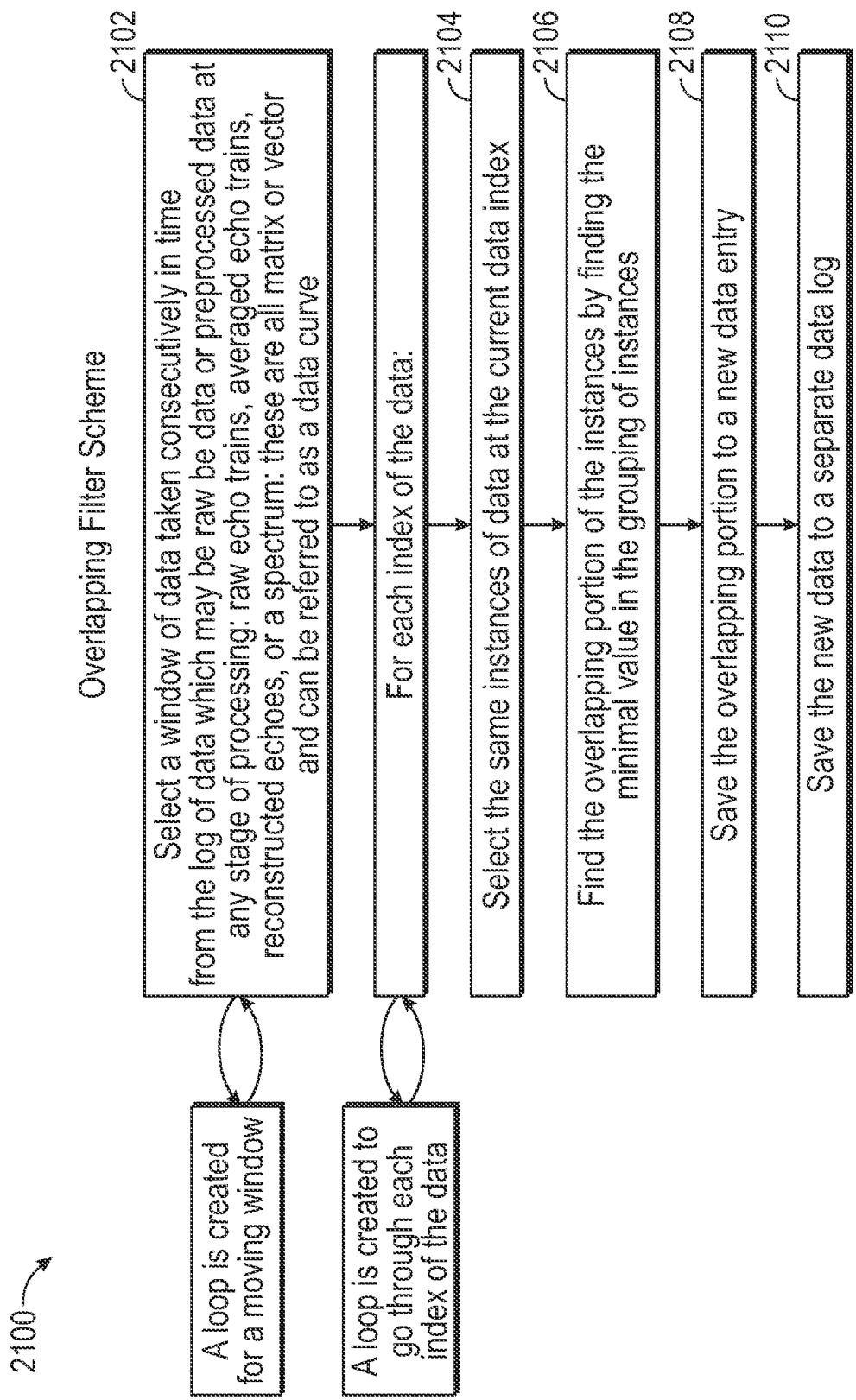
FIG. 21 is a flow diagram illustrating a generalized method of the overlapping/low filter of the present disclosure.

FIG. 21 is a flow diagram illustrating a generalized method of the overlapping/low filter of the present disclosure. The overlapping filter 2100 starts with selecting a window of datasets of the acquired data signals. A loop is applied to create a moving window to analyze other datasets as required by the specified window. At block 2102, the datasets are those data signal sets, or processed datasets acquired adjacent in time. The data may be raw or preprocessed data at any stage of processing. As previously described, such datasets may be raw echo trains, averaged echo trains, reconstructed echoes or a spectrum. One data type is a dataset made up of a vector or matrix of data and is not a single point of data.

Each point of the dataset is an instance of that data and has an index based on the count it is from the beginning of the dataset to the end. For the set of data picked by the window, the same instance (the data point at the same index) of data for each dataset (block 2104) will be compared (block 2106). For example, if the window has a size of 5 (5 datasets), and the data is 50 points long, the filter is applied as such: For index 1, the first instance in each of the 5 dataset curves is selected. This gives 5 points of data to compare across the 5 datasets. For a median filter, the middle most point would be selected. However, for the overlapping/low filters of the present disclosure, the lowest number is selected, thus filtering out the undesired additional signal. At block 2108, the lowest/minimal instance is saved into a new vector or matrix at the same index of where it originated from in the dataset curves. Using a loop, the process is then repeated for the next index: 2, where the 2nd instances from the dataset curve are selected making a second group of 5 points. For the overlapping filter the lowest number is again selected. The number is then stored into the same vector or matrix as the first save point at the second position. The process is then repeated 48 more time so that all 50 points in the five datasets have been filtered creating a new vector or matrix dataset which is saved to a log at block 2110. Then, using a loop, the next window (i.e., moving window) of data curves is selected and the process repeated. If the same number of dataset curves are desired before and after filtering, the filter window size needs to be dynamic. Further, the filter window size does not need to remain the same in general through the process, but the simplest way is to have a single window size.

Figures 22A, 22B:
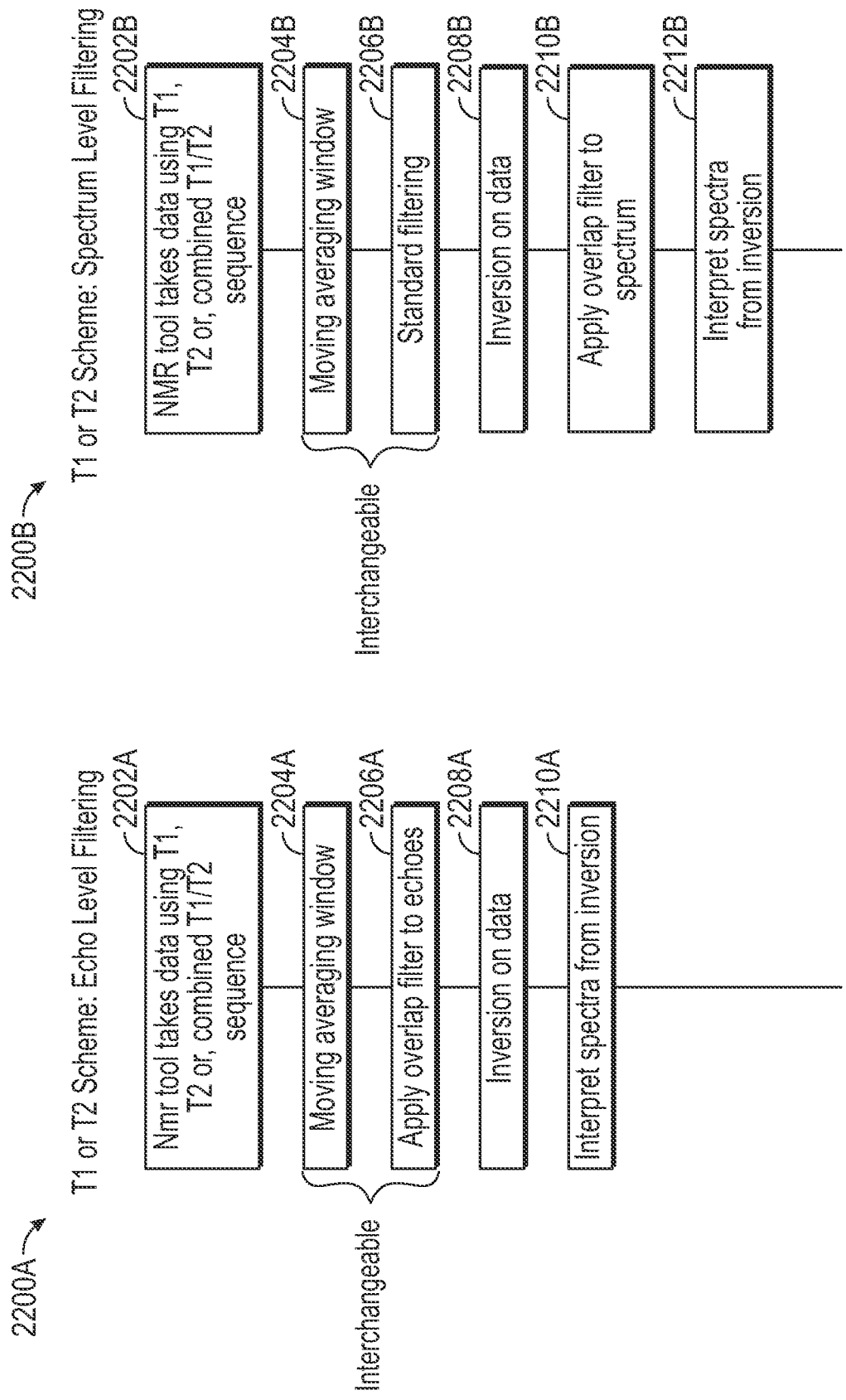
FIGS. 22A and 22B are flow diagrams of alternative methods of filtering the additional signal at the echo level and spectrum level, respectively, according to alternative embodiments of the present disclosure.

FIGS. 22A and 22B are flow diagrams of alternative methods of filtering the additional signal at the echo level and spectrum level, respectively, according to alternative embodiments of the present disclosure. In method 2200A, the NMR echo signals are acquired using T1, T2 or a combined T1/T2 sequence at block 2202A, along with the moving averaging window at block 2204A. At block 2206A, the overlapping filter of FIG. 21 is applied to remove the undesirable signal. In one example, the filter is applied when the high vibration is identified; however, the filter can still be applied even if the vibration level is unknown or low. In yet other examples, the filter is only applied to the data when high vibration is identified. Thus, blocks 2204A and 2206A are interchangeable.

In an alternate embodiment, a median filter may be applied to the echoes either before or after averaging the datasets using the moving window. In contrast to the low filter of the present disclosure which selects the minimal data point of the compared datasets, the median filter selects the median data point of the compared datasets. However, if the overlapping/low filter is being applied to the echoes, it should be applied prior to the median filter. The data additionally needs to be averaged to achieve an acceptable error level. This can be performed by averaging to achieve an overall signal to noise ratio (SNR) in the data as was describe above in the stacking section. Averaging is generally done before inversion, since most inversions are sensitive to changes and can add in artifacts when the SNR is low. The amount of averaging needed will depend on the acceptable final noise level (or error), the configuration of the sensor (since this will change the single echo SNR), and the level of vibrations downhole.

Once the echo trains have gone through some processing (e.g., filtering and averaging or any other preparation methods), the echoes are inverted from the time domain into another domain at block 2208A. The commonly used domains for NMR inversion are relaxation time domain, permeability or diffusion. Some additional processing may need to be applied in addition to the inversion to get the domain to be permeability. The common relaxation time domains are T1 (magnetization polarization time constant) and T2 (magnetization decay time constant). Once the data is inverted, if the overlapping/low filter was not applied at the echo level the overlapping/low filter can be applied to the spectrum to create a new spectrum with less motional artifacts. At block 2210A, the system interprets the spectra generated from the inversion.

In method 2200B, the low filter is applied to the spectrum level. At block 2202B, the NMR echo signals are acquired using T1, T2 or a combined T1/T2 sequence, along with the moving averaging window at block 2204B. At block 2206B, standard filtering may be applied (e.g., median filter, etc.). At block 2208B, the data is inverted to generate the spectra. At block 2210B, the overlapping filter of FIG. 21 is applied to remove the undesirable signal as previously described. At block 2212B, the system interprets the spectra generated from the inversion.

Figures 23A, 23B:
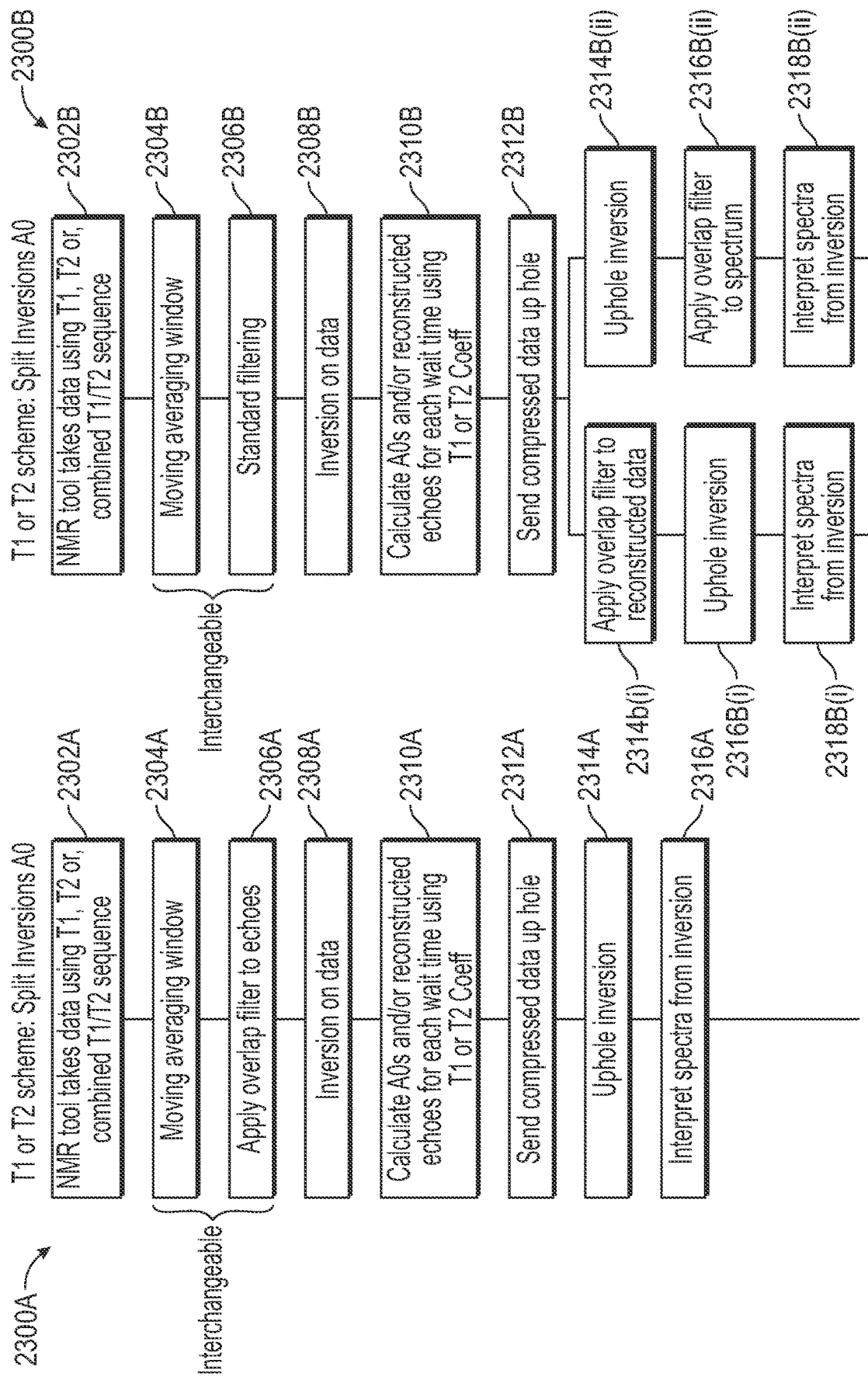
FIG. 23A is a flow diagram of a method of the present disclosure applied to multiple inversion method.
FIG. 23B is a flow diagram of an alternative method, where downhole processing is employed to a multiple inversion method.

FIG. 23A is a flow diagram of a method 2300A of the present disclosure applied to a multiple inversion process where the low filter is applied at the echo train level. After averaging and filtering in this illustrative method, the inversion performed on the T1 data could be either (1) a simultaneous T1/T2 inversion to make the spectrum (and then that result is used to generate the reconstructed echoes) or (2) an inversion where a T2 inversion is done either is followed with A0 or other echo time reconstruction using the inversion result. Alternatively, the method might be applied to T2 data. Where the data is averaged and filtered with a low filter in either order followed by an inversion. Here, after the inversion is complete, the results of the first inversion are used to make reconstructed echoes at A0 and other selected times, the reconstructed echoes can be compressed further, sent up hole, decompressed and then inverted again to make a spectrum. The spectrum is then used for interpretation.

With reference to method 2300A, the data is obtained at block 2302A, averaged at block 2304A and the low filter is applied at bock 2306A, as described in previous methods herein. Thus, in this illustrative method, a multi-inversion is performed where the echoes are filtered down hole and inverted at block 2308A, and then the process is continued as previously outlined where the echoes are reconstructed (block 2310A), sent uphole (2312A), a second inversion performed at block 2314A (this inversion could include a motion inclusive inversion or a standard one) and then the data is interpreted at block 2316A.

FIG. 23B is a flow diagram of an alternative method 2300B, where downhole processing is employed. At block 2302B, the NMR data signals are acquired, averaged at block 2304B, and standard filtering (e.g., median filter) is performed at block 2306B, all occurring downhole. At block 2308B, the echoes are inverted, and then the data reconstructed for sending uphole at block 2310B. The data may also be further compressed after reconstruction before sending uphole at block 2312B. Once the data is uphole, the process may take one of two steps. First, the reconstructed echo datasets may be filtered (using the overlapping/low filters of the present disclosure) on the filtered reconstructed echo datasets (block 2314B(i)), inversion is conducted (block 2316B(i), and the spectra is output at block 2318(i). Typically, these reconstructed echoes would be A0s for T1 sequence, but are not limited thereto. Second, the reconstructed echo datasets are inverted uphole (at block 2314B (ii), then filtered (using overlapping/low filter of the present disclosure) on the spectrum level after the second inversion (at block 2316B(ii), then the spectra are interpreted at block 2318B(ii). Accordingly, if the reconstructed echoes are filtered (block 2314B(i)), the resulting new data log is inverted and the inversion spectrum log used for interpretation. If the spectrum is filtered (block 2316B(ii), a new spectrum log is created and that log is used for interpretation.

In the case of multiple inversion, the intended use of the two step inversion is to have the first inversion done downhole, and the second uphole. However, in the case of removing artifacts from lateral motion (i.e., the high vibration), multi-inversion processing maybe performed all in post processing where the low filter is used on reconstructed echoes. In this case, the steps of sending the data uphole is mute.

Figure 24:
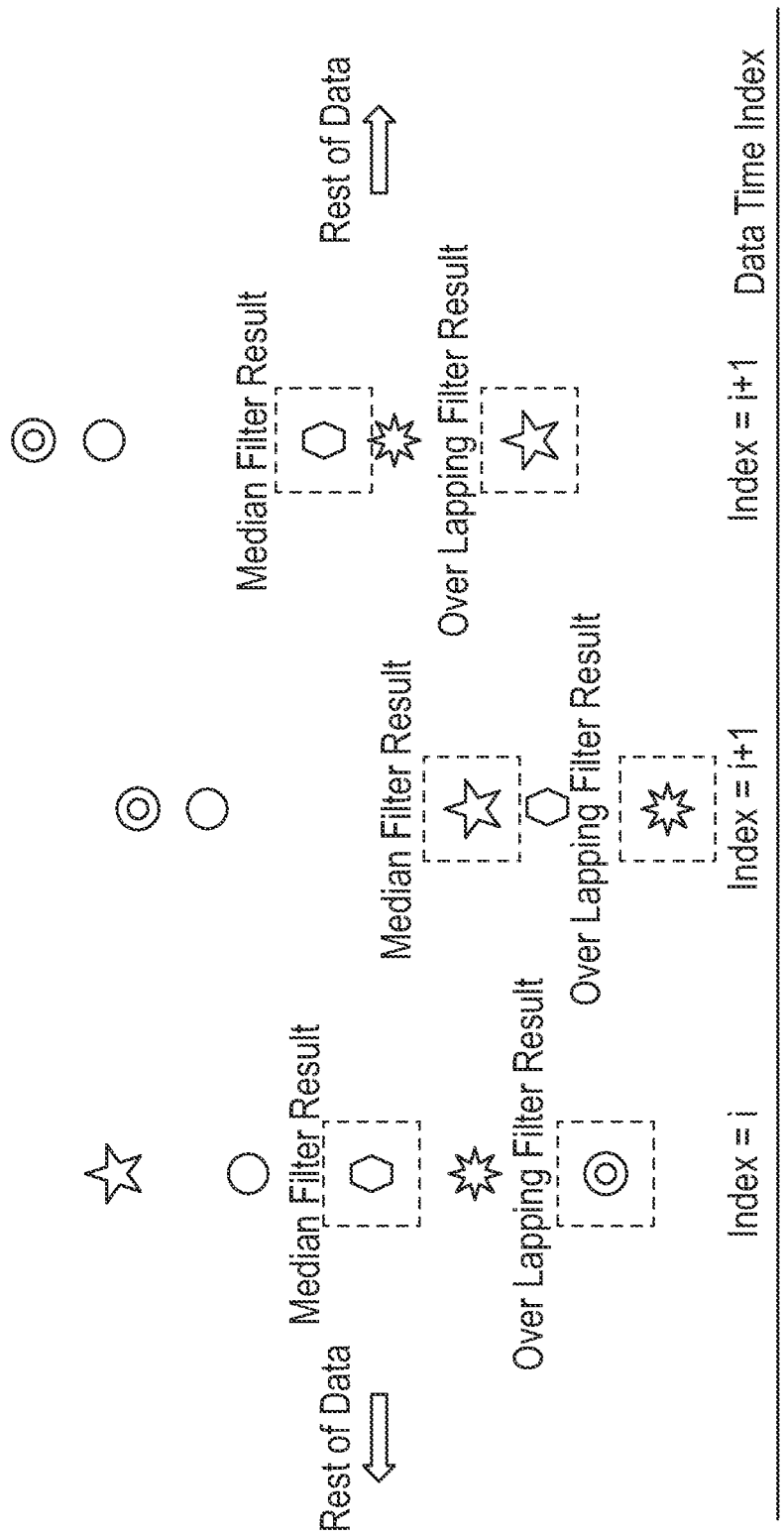
FIG. 24 is a diagram, showing a standard median filter selection of data among a group of data points vs the overlapping filter selection of data among a group of data points.
Figure 25:
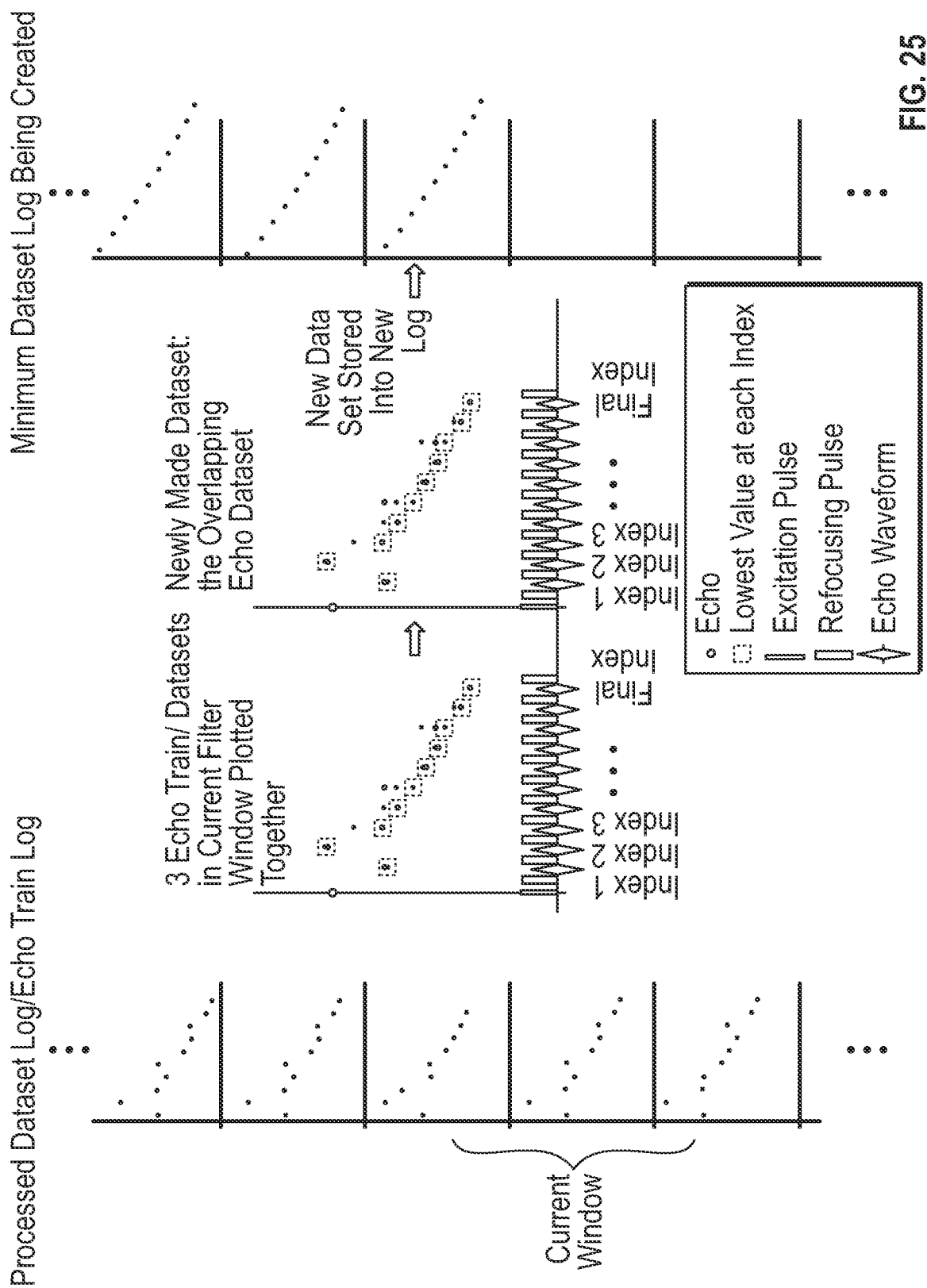
FIG. 25 illustrates two charts showing an example of applying an overlapping/low filter to echoes, and the resulting echo train after the filter has been applied according to an illustrative method of the present disclosure.

FIG. 24 is a diagram, showing a standard median filter selection of data among a group of data points vs the overlapping filter selection of data among a group of data points. FIG. 25 illustrates two graphs showing an example of applying an overlapping/low filter to echoes, according to an illustrative method of the present disclosure. This could also be referred to the "echo level" where level means the stage in the processing, as discussed in FIG. 22A. When the low filter is applied to the echoes, a number of echo trains are selected based on the window size. For this example the window size was 3, so there are 3 echo train taken consecutively in time (shown on the left). The instances of echoes are grouped by their placement in the data, those at the first index are compared to each other. The lowest value from each echo train is selected and a new echo train saved (shown on the right).

Figure 26:
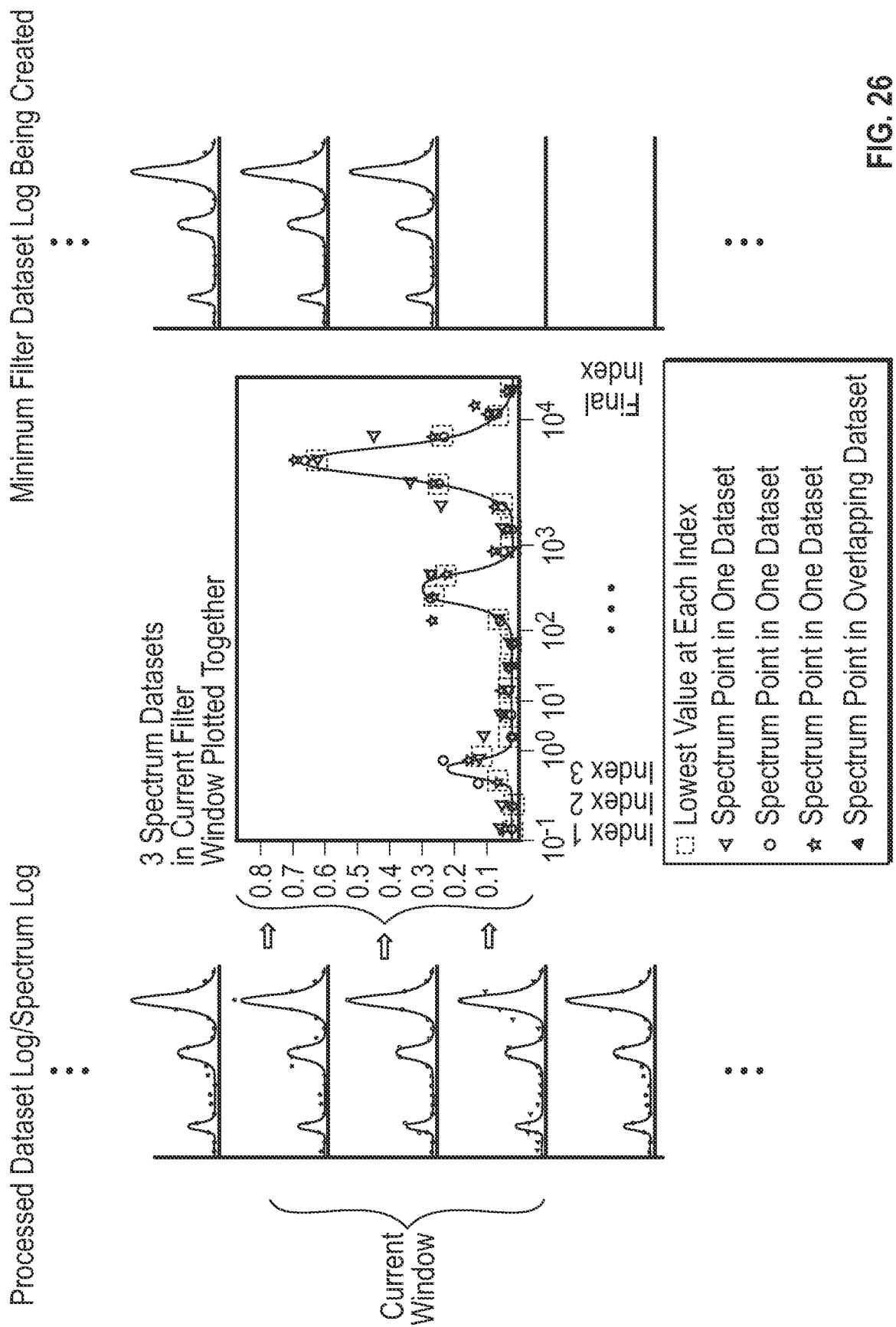
FIG. 26 illustrates a chart showing an example of applying an overlapping filter to the spectrum, as described in FIG. 22B.

FIG. 26 illustrates a chart showing an example of applying an overlapping filter to the spectrum, as described in FIG. 22B. This could also be referred to the "spectrum level", where level means the stage in the processing. When the low filters described herein are applied to the spectrum, a number of spectrum are selected based on the window size. For this example, the window size was 3, so there are 3 spectra taken consecutively in time (shown on the left, and grouped together in the center). The instances of spectrum are grouped by their placement in the data, those at the first index are compared to each other, so on and so forth. The lowest value from each spectra index is selected and a new spectra saved (shown on the right).

Figure 27:
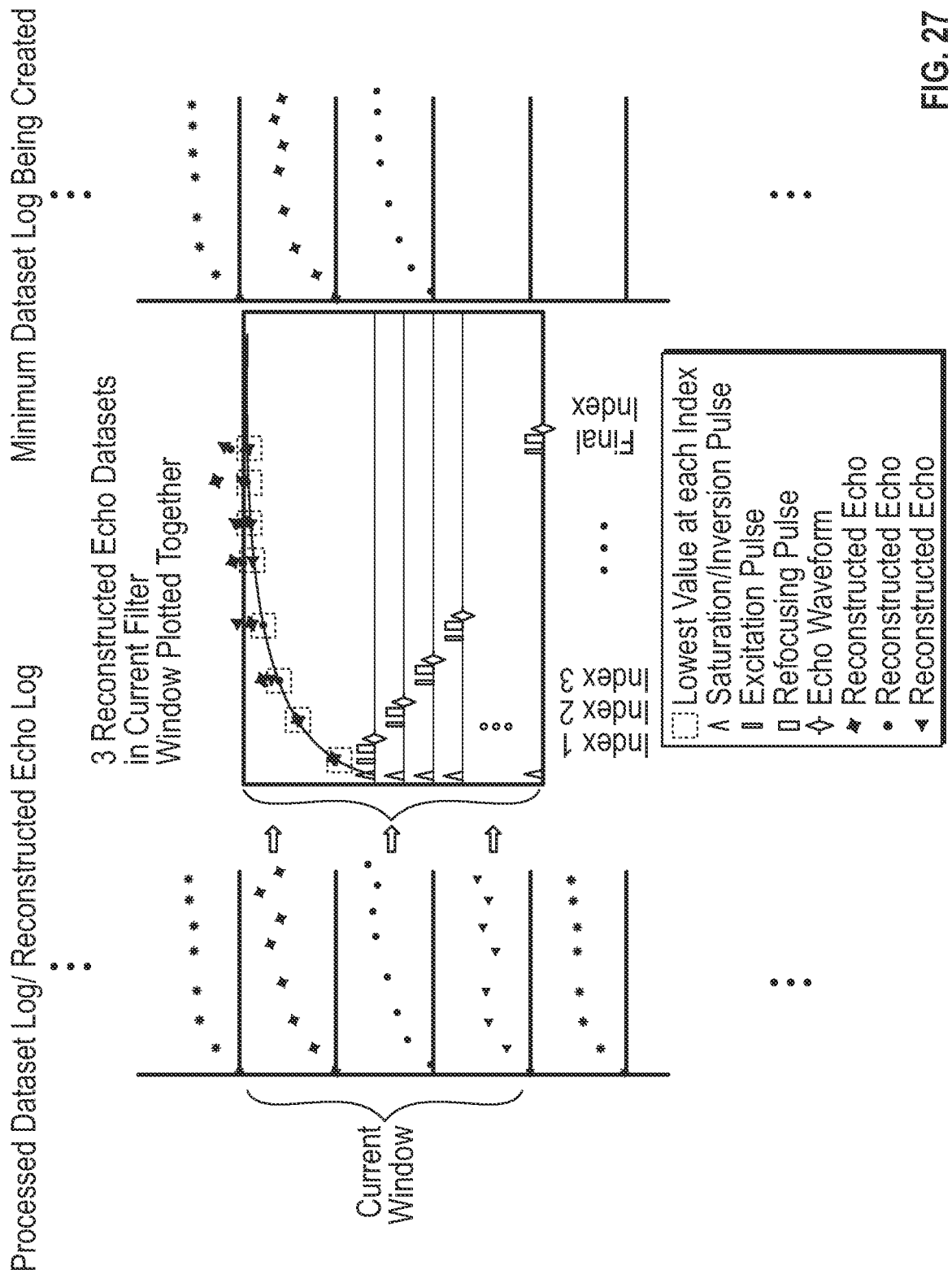
FIG. 27 illustrates a chart showing an example of applying an overlapping filter to the reconstructed echo, specifically the A0, as described in FIG. 23B.

FIG. 27 illustrates a chart showing an example of applying an overlapping filter to the reconstructed echo, specifically the A0, as described in FIG. 23B. This could also be referred to the "A0 level", where level means the stage in the processing and A0 is being used as a short name for all reconstructed echoes. When the low filter described herein is applied to the A0 curve, a number of A0 curves are selected based on the window size. For this example the window size was 3, so there are 3 A0 curves taken consecutively in time (shown on the left). The instances of A0 are grouped by their placement in the data, those at the first index are compared to each other, so on and so forth. The lowest value from each A0 curve index is selected and a new A0 curve saved (shown on the right).

Referring back to FIG. 16, it also illustrates a process to reconstruct a down sampled T2 echo train, according to illustrative methods of the present disclosure. There are a variety of ways in which to select the time position of the echoes being reconstructed. For example, there are two general schemes that can be followed. The first is to preselect the times (1602) and always calculate the Points for that scheme. This scheme is likely to contain the A0 for the echo train. The spacing between echoes could then be linear at multiples of the TE, for instance every 4th echo spacing of the original train is recalculated. The scheme might be non-linear. The shorter T2's have a fast drop off so more points may be selected early on and then fewer at later times to account for that.

Still referring to FIG. 16, a second category of reconstructing the echoes is to have an adaptive scheme that picks the time position of the constructed echoes adaptively (1606). It is good to include A0 and a point where the echoes are either at the end of the time taken from the original echo train, or even just far enough out that the reconstructed echoes are equivocally 0. One adaptive scheme is to have a concentration of points, perhaps separated by TE, around the times where peak show up in the spectrum created by the coefficients. In an adaptive reconstruction, some information about the times of the echoes needs to be sent. This means that the adaptive scheme is less effective than the preselected which will have all the timing info uphole ready for the second part of the inversion.

Figure 28:
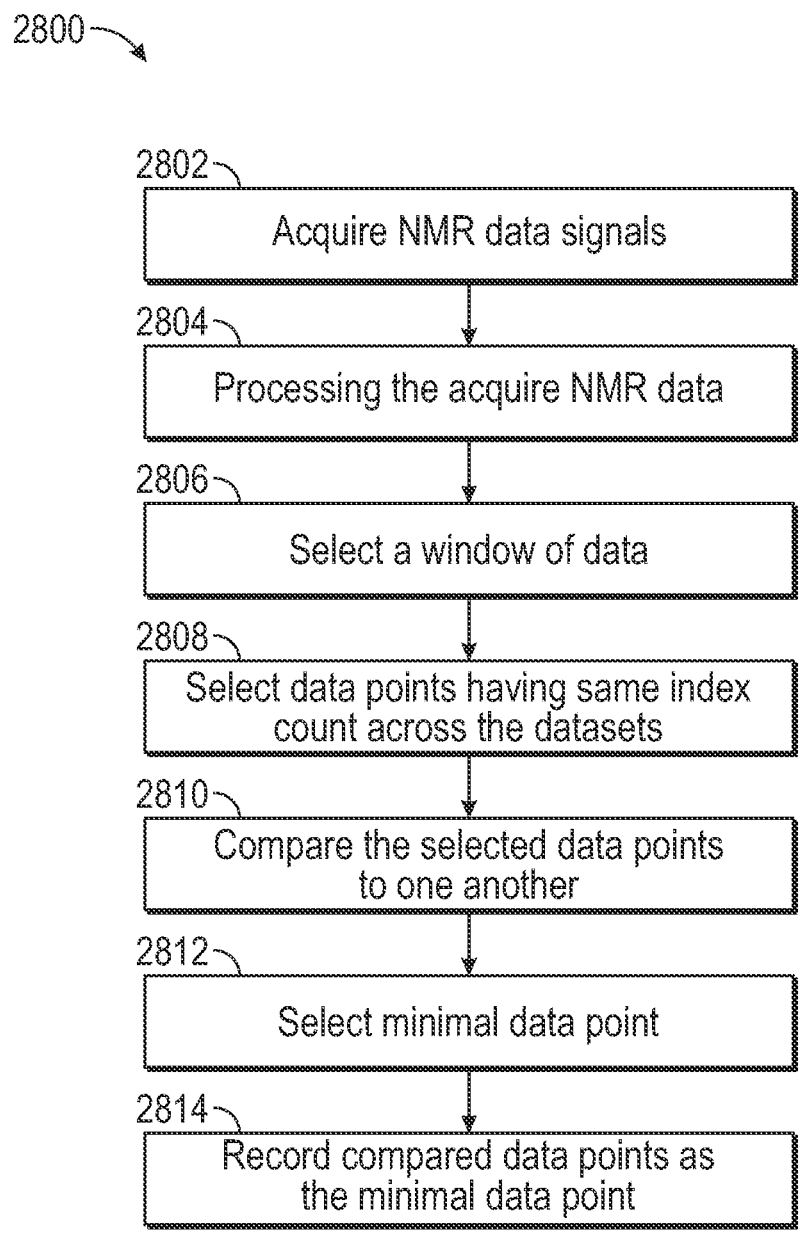
FIG. 28 is a generalized method of generating a log of spectra using NMR, according to certain illustrative methods of the present disclosure.

FIG. 28 is a generalized method of the low/overlapping filter, according to certain illustrative methods of the present disclosure. At block 2802, the system acquires NMR data signals from a downhole logging tool. The received data could take a variety of forms. For example, the data could be an echo train, where the echo train was produced by transmitting multiple pulses on an antenna, and then receiving signal from an antenna after the pulses, excluding the first, and sometimes second pulse. The signal, is deconvoluted and integrated to make an echo. The echoes are grouped together creating an echo train. The received data may be composed of many echo trains, wherein the first pulse is an inversion or saturation pulse. A time follows this pulse, called the wait time which is incremented through different times. The wait time is followed by an excitation pulse, which has multiple recovery pulses after it. Following a recovery pulse, the signal can be received. The received signal is deconvoluted and integrated created a single value known as an echo. The echoes for a sequence with many wait times maybe stored in a vector or a matrix as long as the indexing and associated time from the first pulse is known. The received data can be stored as a vector or a matrix, and will have an associated time vector or matrix for when the data was taken in relation to a specified event, such as an inversion pulse or an excitation pulse depending on the form of the data. The received data, sometimes referred to as raw data, has many points (or numbers), each point within the data might be referred to as an instance of the received data.

At block 2804, the received data is processed to generate processed data. The NMR data may be processed in a variety of ways. For example, the processed data may be data which has undergone no processing steps or data that has undergone many processing steps which can include, but not limited to, filters, averages or inversions. The processed data is made up of several data points (or numbers) and as such may be referred to also as a set of processed data or a group of processed data. The raw data, which is the received data, and until the data has had an inversion applied may be referred to as an echo train.

At block 2806, the system selects, from the acquired processed data, a window of data acquired consecutively in time, as previously described herein. The window of data comprises multiple datasets having multiple data points. Here, each data point has a corresponding index count representing a position of that data point from a beginning of the dataset to an end of the dataset. At block 2808, from each dataset, the system selects data points having a same index count across the datasets. At block 2810, the system then compares the selected data points to one another. At block 2812, from the compared data points, the systems selects the low (or minimal) data point. At block 2814, for the index count being compared across the datasets, the system then records (into a new dataset) the compared data points in each original dataset as the minimal data point for that index count, thereby generating filtered datasets. Thereafter, the new dataset is output as the log. Alternatively, the new dataset may undergo additional processing as described herein to produce final coefficients used in a spectrum, which are ultimately output as a log. The logs may then be used to perform a variety of downhole operations including, for example performing or adjusting a drilling operation, completing a well, etc.

Embodiments and methods described herein further relate to any one or more of the following paragraphs:

1. A method of generating a log of spectra using nuclear magnetic resonance, the method comprising acquiring data signals from operation of a nuclear magnetic resonance logging (NMR) tool in a borehole; processing the data signals to generate processed data; selecting, from the processed data, a window of datasets acquired consecutively in time, the window of data comprising multiple datasets each having data points; wherein each data point has a corresponding index count representing a position of that data point from a beginning of the dataset to an end of the dataset; from each dataset, selecting data points having a same index count across the datasets; comparing the selected data points to one another; from the compared data points, selecting a minimal data point; for the index count being compared, recording the compared data points of each dataset with the minimal data point for that index count into a new dataset, thereby generating filtered datasets; and outputting the filtered datasets as a log.
2. The method as defined in paragraph 1, wherein the datasets are data vectors or data matrices.
3. The method as defined in paragraph 1 or 2, wherein the datasets are raw or processed echo signals.
4. The method as defined in any of paragraphs 1-3, wherein the datasets are reconstructed echoes.
5. The method as defined in any of paragraphs 1-4, wherein the datasets are raw echo trains, averaged echo trains or a spectrum.
6. The method as defined in in any of paragraphs 1-5, wherein the log is used to perform a wellbore operation.
7. The method of in any of paragraphs 1-6, wherein the method is only applied to data that has identified vibrational noise at the time of data acquisition.
8. The method in any of paragraphs 1-7, wherein the method is only applied to data that has identified slip stick at the time of data acquisition.
9. A computer program, stored in a non-transitory computer-readable tangible medium, on which is recorded a computer program, the computer program comprising executable instructions, that, when executed, perform a method comprising:
    acquiring data signals from operation of a nuclear magnetic resonance logging (NMR) tool in a borehole;
    processing the data signals to generate processed data;
    selecting, from the acquired processed data, a window of datasets acquired consecutively in time, the window of data comprising multiple datasets each having data points;
    wherein each data point has a corresponding index count representing a position of that data point from a beginning of the dataset to an end of the dataset;
    from each dataset, selecting data points having a same index count across the datasets;
    comparing the selected data points to one another;
    from the compared data points, selecting a minimal data point;
    for the index count being compared, recording the compared data points of each dataset with the minimal data point for that index count into a new dataset, thereby generating filtered datasets; and
    outputting the filtered datasets as a log.
10. The computer program as defined in paragraph 9, wherein the datasets are data vectors or data matrices.
11. The computer program as defined in paragraphs 9 or 10, wherein the datasets are raw or processed echo signals.
12. The computer program as defined in any of paragraphs 9-11, wherein the datasets are reconstructed echoes.
13. The computer program as defined in any of paragraphs 9-12, wherein the datasets are raw echo trains, averaged echo trains or a spectrum.
14. The computer program as defined in any of paragraphs 9-13, wherein the log is used to perform a downhole operation.
15. A system comprising:
    a nuclear magnetic resonance (NMR) tool;
    a control unit coupled to the NMR tool to control the NMR tool; and
    a downhole processor coupled to the NMR tool and the control unit to perform operations to:
        acquire data signals from operation of a nuclear magnetic resonance logging (NMR) tool in a borehole;
        process the data signals to generate processed data;
        select, from the acquired processed data, a window of datasets acquired consecutively in time, the window of data comprising multiple datasets each having data points;
        wherein each data point has a corresponding index count representing a position of that data point from a beginning of the dataset to an end of the dataset;
        from each dataset, select data points having a same index count across the datasets;
        compare the selected data points to one another;
        from the compared data points, select a minimal data point;
        for the index count being compared, record the compared data points of each dataset with the minimal data point for that index count into a new dataset, thereby generating filtered datasets; and
        output the filtered datasets as a log.
16. The system as defined in paragraph 15, wherein the datasets are data vectors or data matrices.
17. The system as defined in any of paragraphs 15 or 16, wherein the datasets are raw or processed echo signals.
18. The system as defined in any of paragraphs 15-17, wherein the datasets are reconstructed echoes.
19. The system as defined in any of paragraphs 15-18, wherein the datasets are raw echo trains, averaged echo trains or a spectrum.
20. The system as defined in any of paragraphs 15-19, wherein the log is used to perform a downhole operation.

Furthermore, any of the illustrative methods described herein may be implemented by a system comprising processing circuitry or a non-transitory computer readable medium comprising instructions which, when executed by at least one processor, causes the processor to perform any of the methods described herein.

Although various embodiments and methods have been shown and described, the disclosure is not limited to such embodiments and methods and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A method of generating a log of spectra using nuclear magnetic resonance, the method comprising:
   acquiring data signals from operation of a nuclear magnetic resonance logging (NMR) tool in a borehole;
   processing the data signals to generate processed data;
   selecting, from the processed data, a window of datasets acquired consecutively in time, the window of data comprising multiple datasets each having data points, wherein the multiple datasets comprise overlapping data points;
   wherein each data point has a corresponding index count representing a position of that data point from a beginning of the dataset to an end of the dataset;
   from each dataset, selecting data points having a same index count across the datasets;
   comparing the selected data points to one another;
   from the compared data points, selecting a minimal data point;
   for the index count being compared, generating filtered datasets by replacing the data on the index count with the minimal data point, wherein the index count labels the position of every dataset from the multiple datasets; and
   outputting the filtered datasets as a log.

2. The method as defined in claim 1, wherein the datasets are data vectors or data matrices.

3. The method as defined in claim 1, wherein the datasets are raw or processed echo signals.

4. The method as defined in claim 1, wherein the datasets are reconstructed echoes.

5. The method as defined in claim 1, wherein the datasets are raw echo trains, averaged echo trains or a spectrum.

6. The method as defined in claim 1, wherein the log is used to perform a wellbore operation.

7. The method as defined in claim 1, wherein the method is only applied to data that has identified vibrational noise at the time of data acquisition.

8. The method as defined in claim 1, wherein the method is only applied to data that has identified slip stick at the time of data acquisition.

9. A computer program, stored in a non-transitory computer-readable tangible medium, on which is recorded a computer program, the computer program comprising executable instructions, that, when executed, perform a method comprising:
   acquiring data signals from operation of a nuclear magnetic resonance logging (NMR) tool in a borehole;
   processing the data signals to generate processed data;
   selecting, from the acquired processed data, a window of datasets acquired consecutively in time, the window of data comprising multiple datasets each having data points, wherein the multiple datasets comprise overlapping data points;
   wherein each data point has a corresponding index count representing a position of that data point from a beginning of the dataset to an end of the dataset;
   from each dataset, selecting data points having a same index count across the datasets;
   comparing the selected data points to one another;
   from the compared data points, selecting a minimal data point;
   for the index count being compared, generating filtered datasets by replacing the data on the index count with the minimal data point, wherein the index count labels the position of every dataset from the multiple datasets; and
   outputting the filtered datasets as a log.

10. The computer program as defined in claim 9, wherein the datasets are data vectors or data matrices.

11. The computer program as defined in claim 9, wherein the datasets are raw or processed echo signals.

12. The computer program as defined in claim 9, wherein the datasets are reconstructed echoes.

13. The computer program as defined in claim 9, wherein the datasets are raw echo trains, averaged echo trains or a spectrum.

14. The computer program as defined in claim 9, wherein the log is used to perform a downhole operation.

15. A system comprising:
   a nuclear magnetic resonance (NMR) tool;
   a control unit coupled to the NMR tool to control the NMR tool; and
   a downhole processor coupled to the NMR tool and the control unit to perform operations to:
      acquire data signals from operation of a nuclear magnetic resonance logging (NMR) tool in a borehole;
      process the data signals to generate processed data;
      select, from the acquired processed data, a window of datasets acquired consecutively in time, the window of data comprising multiple datasets each having data points, wherein the multiple datasets comprise overlapping data points;
      wherein each data point has a corresponding index count representing a position of that data point from a beginning of the dataset to an end of the dataset;
      from each dataset, select data points having a same index count across the datasets;
      compare the selected data points to one another;
      from the compared data points, select a minimal data point;
      for the index count being compared, generating filtered datasets by replacing the data on the index count with the minimal data point, wherein the index count labels the position of every dataset from the multiple datasets; and
      output the filtered datasets as a log.

16. The system as defined in claim 15, wherein the datasets are data vectors or data matrices.

17. The system as defined in claim 15, wherein the datasets are raw or processed echo signals.

18. The system as defined in claim 15, wherein the datasets are reconstructed echoes.

19. The system as defined in claim 15, wherein the datasets are raw echo trains, averaged echo trains or a spectrum.

20. The system as defined in claim 15, wherein the log is used to perform a downhole operation.

* * * * *